United States Patent
Tachibana et al.

(10) Patent No.: US 8,643,044 B2
(45) Date of Patent: Feb. 4, 2014

(54) SEMICONDUCTOR LIGHT EMITTING DEVICE

(75) Inventors: Koichi Tachibana, Kanagawa-ken (JP); Shigeya Kimura, Tokyo (JP); Toshiki Hikosaka, Tokyo (JP); Taisuke Sato, Kanagawa-ken (JP); Toshiyuki Oka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 13/222,912

(22) Filed: Aug. 31, 2011

(65) Prior Publication Data

US 2012/0061713 A1   Mar. 15, 2012

Related U.S. Application Data

(63) Continuation of application No. PCT/JP2009/066166, filed on Sep. 16, 2009.

(51) Int. Cl.
*H01L 33/00*   (2010.01)

(52) U.S. Cl.
USPC ......... 257/98; 257/99; 257/457; 257/E33.003

(58) Field of Classification Search
None
See application file for complete search history.

(56) References Cited

U.S. PATENT DOCUMENTS

| | | | | |
|---|---|---|---|---|
| 7,511,306 | B2 * | 3/2009 | Kato et al. | 257/79 |
| 2008/0308833 | A1 * | 12/2008 | Moriyama et al. | 257/99 |
| 2010/0012971 | A1 * | 1/2010 | Hiraoka et al. | 257/103 |
| 2010/0224887 | A1 | 9/2010 | Shibata et al. | |

FOREIGN PATENT DOCUMENTS

| | | |
|---|---|---|
| JP | 10-123517 | 5/1998 |
| JP | 10-341038 | 12/1998 |
| JP | 2007-123517 | 5/2007 |
| JP | 2008-227109 | 9/2008 |
| JP | 2011-531700 | 9/2011 |

OTHER PUBLICATIONS

Office Action issued Oct. 28, 2011 in Japanese Patent Application No. 2011-531700 (with English translation).
International Search Report issued Oct. 20, 2009 in PCT/JP2009/066166 filed Sep. 16, 2009.
Office Action issued Jun. 20, 2013 in Japanese Application No. 2011-282780 (With English Translation).

* cited by examiner

*Primary Examiner* — Alonzo Chambliss
(74) *Attorney, Agent, or Firm* — Oblon, Spivak, McClelland, Maier & Neustadt, L.L.P.

(57) ABSTRACT

According to one embodiment, a semiconductor light emitting device includes: a stacked structure body, first and second electrodes, and a pad layer. The body includes first semiconductor layer of a first conductivity type, a light emitting layer, and a second semiconductor layer of second conductivity type. The first semiconductor layer has first and second portions. The light emitting layer is provided on the second portion. The second semiconductor layer is provided on the light emitting layer. The first electrode is provided on the first portion. The second electrode is provided on the second semiconductor layer and is transmittable to light emitted from the light emitting layer. The pad layer is connected to the second electrode. A transmittance of the pad layer is lower than that of the second electrode. A sheet resistance of the second electrode increases continuously along a direction from the pad layer toward the first electrode.

21 Claims, 16 Drawing Sheets

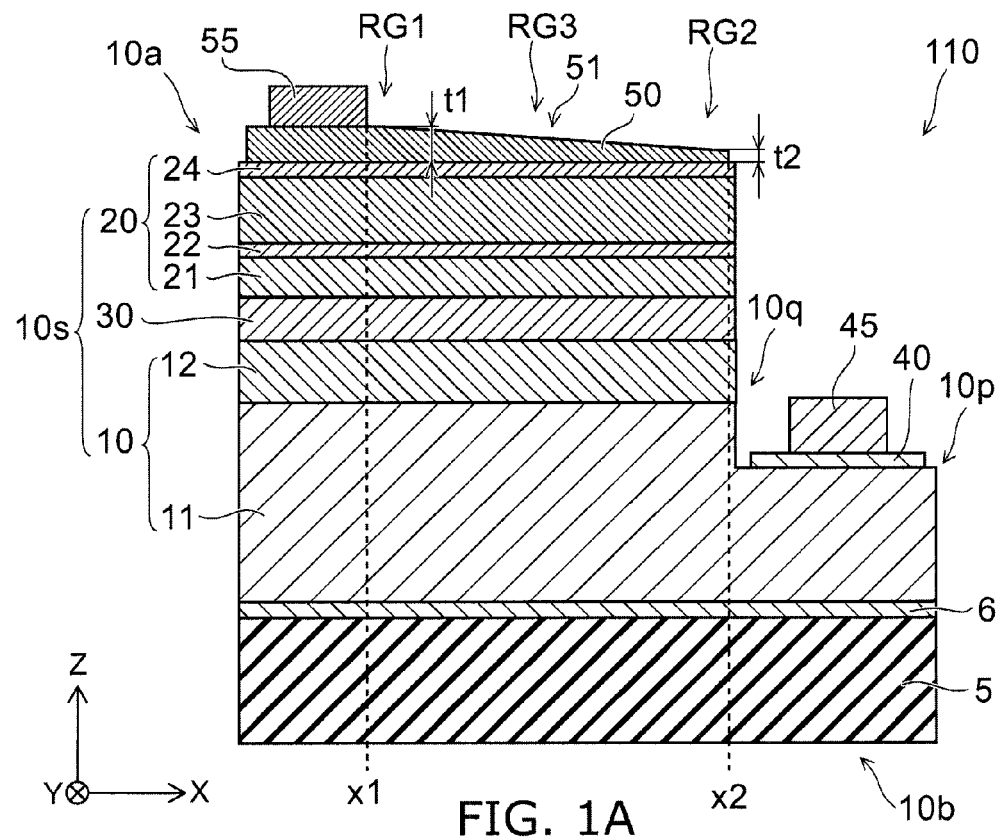
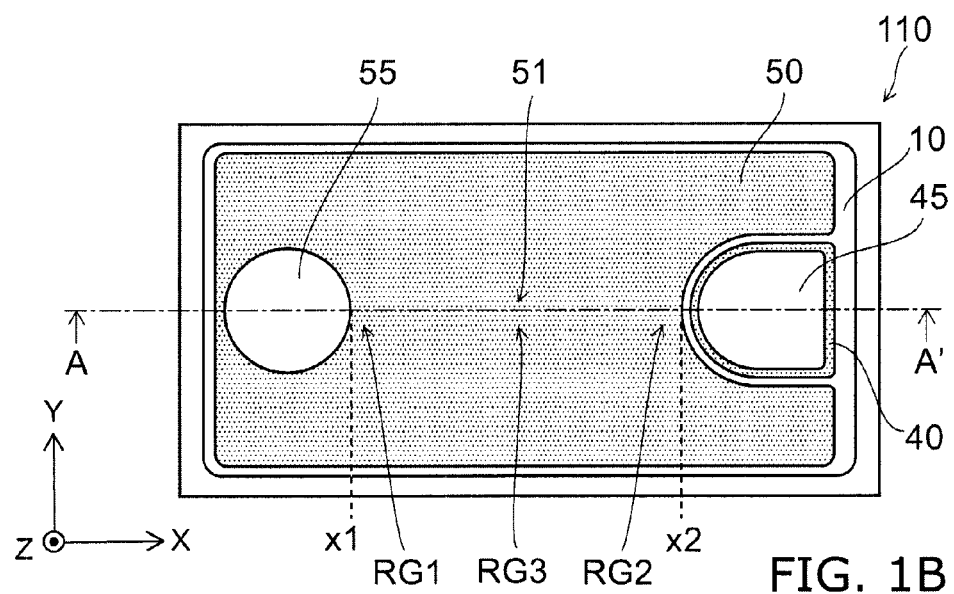
FIG. 1A
FIG. 1B

SEMICONDUCTOR LIGHT EMITTING DEVICE

CROSS-REFERENCE TO RELATED APPLICATIONS

This is a continuation application of International Application PCT/JP2009/066166, filed on Sep. 16, 2009; the entire contents of which are incorporated herein by reference.

FIELD

Embodiments described herein relate generally to a semiconductor light emitting device.

BACKGROUND

A semiconductor light emitting device using a nitride-based III to V group compound semiconductor such as gallium nitride (GaN) is applied to a high-luminance light emitting diode (LED) of ultraviolet to blue/green or a laser diode (LD) of blue-purple to blue, for example.

In a semiconductor light emitting device, an injection current is increased in order to obtain light emission of a high output. On this occasion, when the distribution of injection current is uneven in the device, at a part where an injection current density is excessively large, quantum efficiency lowers and light emission efficiency also lowers. Further, reliability may deteriorate sometimes due to heat generation.

Patent Literature 1 discloses, in a semiconductor light emitting device of a surface mounting type using an optically transparent positive electrode, a structure that allows a pad electrode to reduce photo absorption by providing a structure having two regions including a region of a high sheet resistance and a region of a low sheet resistance in the positive electrode. Even with such a structure, however, there still is a room for improvement in increasing efficiency.

BRIEF DESCRIPTION OF THE DRAWINGS

FIGS. 1A and 1B are schematic views illustrating the configuration of a semiconductor light emitting device according to a first embodiment;

DETAILED DESCRIPTION

Figure 2:
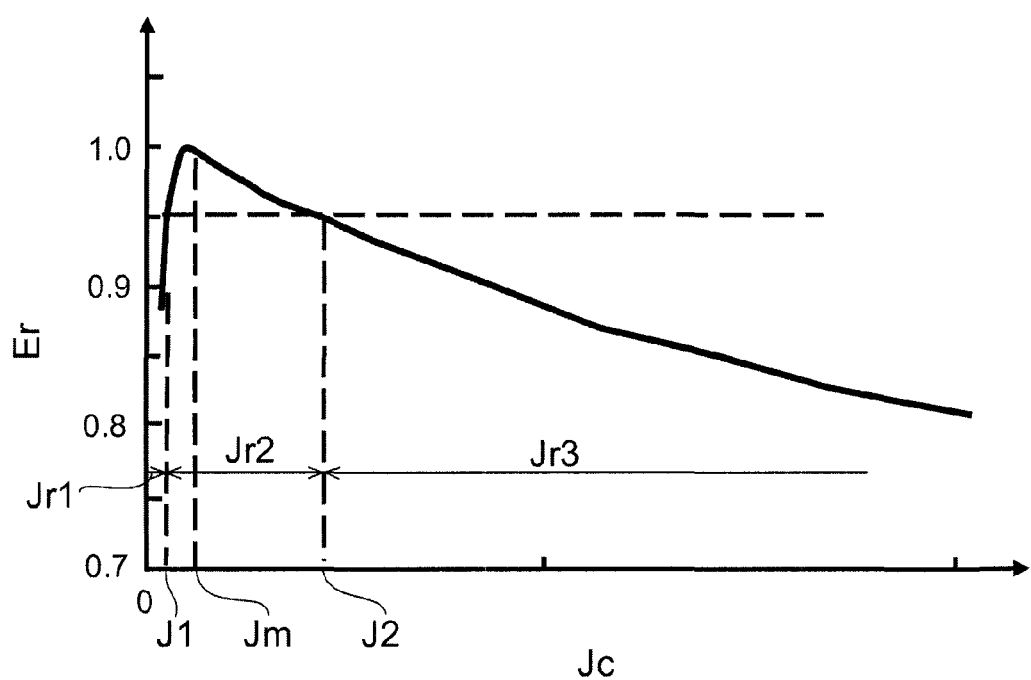
FIG. 2 is a graph illustrating the characteristics of the semiconductor light emitting device according to the first embodiment.

In general, according to one embodiment, a semiconductor light emitting device includes: a stacked structure body, a first electrode, a second electrode, and a pad layer. The stacked structure body includes a first semiconductor layer of a first conductivity type, a light emitting layer, and a second semiconductor layer of a second conductivity type. The first semiconductor layer has a first portion, and a second portion provided adjacent to the first portion in a plane parallel to a surface of the first semiconductor layer. The light emitting layer is provided on the second portion. The second semiconductor layer is provided on the light emitting layer. The first electrode is provided on the first portion and contacts the first semiconductor layer. The second electrode is provided on the second semiconductor layer, contacts the second semiconductor layer and is transmittable with respect to light emitted from the light emitting layer. The pad layer is electrically connected to the second electrode. A transmittance of the pad layer to the light is lower than a transmittance of the second electrode to the light. A sheet resistance of the second electrode increases continuously along a direction going from the pad layer toward the first electrode.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIGS. 1A and 1B are schematic views illustrating the configuration of a semiconductor light emitting device according to a first embodiment.

FIG. 1B is a schematic plan view and FIG. 1A is a sectional view taken along A-A' line in FIG. 1B.

As shown in FIGS. 1A and 1B, a semiconductor light emitting device 110 according to the embodiment includes a stacked structure body 10s, a first electrode 40, a second electrode 50, and a pad layer 55.

The stacked structure body 10s has a first semiconductor layer 10 of a first conductivity type, a second semiconductor layer 20 of a second conductivity type, and a light emitting layer 30 provided between the first semiconductor layer 10 and the second semiconductor layer 20. In the stacked structure body 10s, the second semiconductor layer 20 and the light emitting layer 30 are selectively removed on the side of a major surface 10a of the stacked structure body 10s on the side of the second semiconductor layer 20 and a part (a first portion 10p) of the first semiconductor layer 10 is exposed on the side of the major surface 10a.

In this way, the stacked structure body 10s has the first semiconductor layer 10, the second semiconductor layer 20 opposing a part of the first semiconductor layer 10, and the light emitting layer 30 provided between the part of the first semiconductor layer 10 and the second semiconductor layer 20. The stacked structure body 10s has the major surface 10a on the side of the second semiconductor layer 20.

In addition, as the light emitting layer 30, an active layer of a single quantum well structure or a multiple quantum well structure can be used. Further, as the first semiconductor layer 10, the second semiconductor layer 20, and the light emitting layer 30, a nitride-based semiconductor can be used for example.

Here, the first conductivity type is an n-type for example and the second conductivity type is a p-type for example. The embodiment is not limited to the case and it is also possible that the first conductivity type is a p-type and the second conductivity type is an n-type. Explanations are made hereunder assuming that the first conductivity type is an n-type and the second conductivity type is a p-type.

The first electrode 40 is provided in contact with the part (the first portion 10p) of the first semiconductor layer 10 exposed on the side of the major surface 10a. That is, the first electrode 40 is provided on the part (the first portion 10p) exposed on the side of the major surface 10a of the first semiconductor layer 10. The first electrode 40 contacts the first semiconductor layer 10 on the major surface 10a.

The second electrode 50 is provided in contact with the second semiconductor layer 20 on the side of the major surface 10a of the stacked structure body 10s and is transparent to light emitted from the light emitting layer 30. The second electrode 50 contacts the second semiconductor layer 20 on the major surface 10a.

That is, the first semiconductor layer 10 has a first portion 10p and a second portion 10q. The second portion 10q is provided adjacent to the first portion 10p in a plane parallel to a surface of the first semiconductor layer 10. The light emitting layer 30 is provided on the second portion 10q. The second semiconductor layer 20 is provided on the light emitting layer 30. The first electrode 40 is provided on the first portion 10p and contacts the first semiconductor layer 10. The second electrode 50 is provided on the second semiconductor layer 20 and contacts the second semiconductor layer 20.

In the semiconductor light emitting device 110, light emitted from the light emitting layer 30 is mainly output from the side of the major surface 10a of the stacked structure body 10s. That is, light passes through the second electrode 50 having optical transparency and is taken out mainly to the outside of the semiconductor light emitting device 110.

The pad layer 55 is provided on the side of the major surface 10a of the second semiconductor layer 20 (on the opposite side of the light emitting layer 30 with respect to the second semiconductor layer 20) and electrically connected to the second electrode 50. Then, transmissivity of the pad layer 55 to light emitted from the light emitting layer 30 is lower than that of the second electrode 50. That is, transmissivity to light emitted from the light emitting layer 30 is larger in the second electrode 50 than in the pad layer 55. As the pad layer 55, a film of a single layer or a stacked layer comprising various kinds of metals can be used. The electric conductivity of the pad layer 55 can be set so as to be higher than that of the second electrode 50 for example.

Then, in the semiconductor light emitting device 110, the sheet resistance of the second electrode 50 increases continuously along the direction going from the pad layer 55 toward the first electrode 40.

That is, the sheet resistance of the second electrode 50 increases gradually along the direction going from the pad layer 55 toward the first electrode 40.

The second electrode 50 has a first region RG1 in the vicinity of the pad layer 55, a second region RG2 in the vicinity of the first electrode 40, and a third region RG3 between the first region RG1 and the second region RG2, and a first sheet resistance R1 in the first region RG1 is lower than a sheet resistance R2 in the second region RG2 and a third sheet resistance R3 of the third region RG3 is a value between the first sheet resistance R1 and the second sheet resistance R2, for example. In this way, in the semiconductor light emitting device 110 according to the embodiment, the first region RG1 having a low sheet resistance Rs, the second region RG2 having a high sheet resistance Rs, and the third region RG3 having an intermediate characteristic between the two sheet resistances are provided.

In the specific example, the thickness of the second electrode 50 decreases continuously along the direction going from the pad layer 55 toward the first electrode 40. That is, the thickness of the second electrode 50 decreases gradually along the direction going from the pad layer 55 toward the first electrode 40. In the third region RG3 between the first region RG1 in the vicinity of the pad layer 55 and the second layer RG2 in the vicinity of the first electrode 40, the thickness of the second electrode 50 is an intermediate value between the first region RG1 and the second region RG2.

The embodiment is not limited to the specific example. As far as the sheet resistance of the second electrode 50 increases continuously along the direction going from the pad layer 55 toward the first electrode 40, various modifications are acceptable as it will be described later.

With such a configuration, the semiconductor light emitting device 110 can equalize the distribution of an injection current density and inhibit an excessively large injection current density. The characteristics are described later.

In addition, in the semiconductor light emitting device 110, the second electrode 50 has a region 51 between the pad layer 55 and the first electrode 40 and, in the region 51, the sheet resistance of the second electrode 50 increases continuously along the direction going from the pad layer 55 toward the first electrode 40.

As the second electrode 50, a so-called transparent electrode such as ITO (Indium Tin Oxide) or ZnO can be used for example. That is, the second electrode 50 can contain oxide including at least one of indium, tin and zinc. Thereby, it is possible to obtain electric conductivity, optical transparency and characteristics excellent in practical use, such as chemical stability and the ease of processing.

In the specific example, the pad layer 55 is provided on the second electrode 50 (on the opposite side of the second semiconductor layer 20 with respect to the second electrode 50). The embodiment is not limited to the specific example. The pad layer 55 is provided on the side of the major surface 10a of the second semiconductor layer 20 and electrically connected to the second electrode 50, and for example, a configuration where the pad layer 55 is provided on the second semiconductor layer 20 via an insulating layer and electrically connected to the second electrode 50 may be acceptable.

In the specific example further, a first electrode pad layer 45 is provided on the first electrode 40 (on the opposite side of the first semiconductor layer 10 with respect to the first electrode 40).

Here, the stacking direction of the first semiconductor layer 10, the light emitting layer 30, and the second semiconductor layer 20 in the stacked structure body 10s is defined as the Z axis direction. Then, the direction where the pad layer 55 and the first electrode 40 oppose each other is defined as the X axis direction. The X axis direction is a direction going from the pad layer 55 toward the first electrode 40. Further, the direction perpendicular to the Z axis direction and the X axis direction is defined as the Y axis direction.

As illustrated in FIGS. 1A and 1B, a position in the X axis direction where the pad layer 55 and the first electrode 40 oppose each other is defined as a position x. Then, a position in the X axis direction at an end of the pad layer 55 on the side of the first electrode 40 is defined as a first position x1 and a position in the X axis direction of the first electrode 40 on the side of the pad layer 55 is defined as a second position x2.

A first thickness t1 of the second electrode 50 at the first position x1 (a thickness of the second electrode 50 on the side of the pad layer 55) is set at 250 nm (nanometers) for example and a second thickness t2 of the second electrode 50 at the second position x2 (a thickness of the second electrode 50 on the side of the first electrode 40) is set at 180 nm for example. In this way, the first thickness t1 is larger than the second thickness t2 and the thickness changes continuously.

A specific example of a semiconductor light emitting device 110 according to the embodiment is explained below.

As illustrated in FIG. 1A, the semiconductor light emitting device 110 has a sapphire substrate 5 on a rear face 10b on the opposite side of the major surface 10a with respect to the stacked structure body 10s. A buffer layer 6 is provided on the substrate 5 and the stacked structure body 10s is provided thereon.

In addition, the stacked structure body 10s includes an n-type GaN layer 11, an n-type GaN guide layer 12, a light emitting layer 30, a p-type GaN first guide layer 21, a p-type AlGaN layer 22 (an electron overflow preventive layer), a p-type GaN second guide layer 23, and a p-type GaN contact layer 24, those being stacked from the side of the substrate 5 in sequence. The n-type GaN layer 11 and the n-type GaN guide layer 12 are included in the first semiconductor layer 10 and the p-type GaN first guide layer 21, the p-type AlGaN layer 22, the p-type GaN second guide layer 23, and the p-type GaN contact layer 24 are included in the second semiconductor layer 20.

The stacked structure body 10s is formed as follows for example.

After the buffer layer 6 is formed on the sapphire substrate 5, the n-type GaN layer 11 doped with n-type impurities is crystal-grown. For the crystal growth of the n-type GaN layer 11, a metal organic chemical vapor deposition (MOCVD) method is used for example. Otherwise, the crystal growth may be carried out by a molecular beam epitaxy (MBE) method.

A material used as the substrate 5 is arbitrarily selected. As the substrate 5, besides sapphire, GaN, SiC, Si, GaAs, etc. can be used for example.

As the n-type impurities in the n-type GaN layer 11, various elements such as Si, Ge, and Sn can be used but Si is used here. The quantity of Si doped in the n-type GaN layer 11 is considered to be about $2\times10^{18}$ cm$^{-3}$ for example.

Successively, the n-type GaN guide layer 12 is crystal-grown on the n-type GaN layer 11. As the n-type GaN guide layer 12, a GaN layer being doped with n-type impurities of about $1\times10^{18}$ cm$^{-3}$ and having a film thickness of about 0.1 μm (micrometer) can be used for example.

In addition, a growth temperature when the n-type GaN layer 11 and the n-type GaN guide layer 12 are grown can be set at not less than 1,000° C. and not more than 1,100° C.

Further, as the n-type GaN guide layer 12, not a GaN layer but $In_{0.01}Ga_{0.99}N$ of about 0.1 μm in film thickness may also be used. When $In_{0.01}Ga_{0.99}N$ is used as the n-type GaN guide layer 12, the growth temperature can be set at not less than 700° C. and not more than 800° C. for example.

Successively, the light emitting layer 30 is formed on the n-type GaN guide layer 12. In forming the light emitting layer 30, an active layer of a multiple quantum well (MQW) structure formed by alternately stacking a quantum well layer and barrier layers disposed on both the sides (the upper and lower sides) of the quantum well layer is formed. As the single quantum well layer, an undoped $In_{0.2}Ga_{0.8}N$ layer of about 2.5 nm in film thickness can be used for example. As one of the barrier layers, an $In_{0.02}Ga_{0.98}N$ layer of about 12.5 nm in film thickness can be used for example. The growth temperatures of the quantum well layer and the barrier layers can be set at not less than 700° C. and not more than 800° C. for example. Further, the quantum well layer and the barrier layers are designed so that the wavelength of photoluminescence in the light emitting layer 30 may be 450 nm at room temperature.

Successively, the p-type GaN first guide layer 21 is grown on the light emitting layer 30. As the p-type GaN first guide layer 21, a GaN layer of about 30 nm in film thickness can be used for example. The growth temperature of GaN used for the p-type GaN first guide layer 21 is not less than 1,000° C. and not more than 1,100° C. for example. As the p-type impurities used in the p-type GaN first guide layer 21, various elements such as Mg and Zn can be used for example. Here, Mg is used. The quantity of Mg doped in the p-type GaN first guide layer 21 can be about $4\times10^{18}$ cm$^{-3}$ for example. Meanwhile, as the p-type GaN first guide layer 21, an $In_{0.01}Ga_{0.99}N$ layer of about 30 nm in film thickness may also be used. When the $In_{0.01}Ga_{0.99}N$ layer is used as the p-type GaN first guide layer 21, the growth temperature can be set at not less than 700° C. and not more than 800° C. for example.

Successively, the p-type AlGaN layer 22 is grown on the p-type GaN first guide layer 21. As the p-type AlGaN layer 22, an $Al_{0.2}Ga_{0.8}N$ layer of about 10 nm in film thickness doped with p-type impurities can be used for example. The quantity of Mg doped in the p-type AlGaN layer 22 is set to about $4\times10^{18}$ cm$^{-3}$ for example. The growth temperature of the $Al_{0.2}Ga_{0.8}N$ layer used as the p-type AlGaN layer 22 is set to not less than 1,000° C. and not more than 1,100° C. for example.

Successively, the p-type GaN second guide layer 23 is grown on the p-type AlGaN layer 22. The quantity of Mg doped in the p-type GaN second guide layer 23 is set to about $1\times10^{19}$ cm$^{-3}$ for example. The film thickness of the p-type GaN second guide layer 23 is set to about 50 nm for example. The growth temperature of the GaN layer used as the p-type GaN second guide layer 23 is set to not less than 1,000° C. and not more than 1,100° C. for example.

Finally, the p-type GaN contact layer 24 is grown on the p-type GaN second guide layer 23. The quantity of Mg doped in the p-type GaN contact layer 24 is set to about $1 \times 10^{20}$ cm$^{-3}$ for example. The film thickness of the p-type GaN contact layer 24 is set to about 60 nm for example.

In this way, the stacked structure body 10s is formed on the substrate 5. Further, the following device processes are applied to the stacked structure body 10s.

A second electrode 50 is formed on the p-type GaN contact layer 24. For the second electrode 50, ITO is used for example. In forming the second electrode 50, it is possible to continuously decrease the thickness of the second electrode 50 along the direction going from a region to be a pad layer 55 toward the first electrode 40 by forming an ITO film of 250 nm for example on the p-type GaN contact layer 24, thereon forming a mask in which at least one of the area of the opening and the transmissivity thereof changes by using a halftone mask, and applying dry etching for example.

Thereafter, dry etching is applied to a part of the region of the second electrode 50, the second semiconductor layer 20, and the light emitting layer 30 and the n-type GaN layer 11 is exposed. The exposed n-type GaN layer 11 comes to be the exposed part (the first portion 10p) of the first semiconductor layer 10. The first electrode 40 is formed on the n-type GaN layer 11. As the first electrode 40, a composite film of titanium-platinum-gold (Ti/Pt/Au) can be used for example. That is, as the first electrode 40, a film formed by stacking a Ti film of about 0.05 µm in film thickness, a Pt film of about 0.05 µm in film thickness, and an Au film of about 0.2 µm in film thickness can be used for example.

Thereafter, the pad layer 55 and a first electrode pad layer 45 are formed on the second electrode 50 and the first electrode 40, respectively. That is, an Au film of 1.0 µm in film thickness is formed on the second electrode 50 and the first electrode 40 for example and the Au film comes to be the pad layer 55 and the first electrode pad layer 45.

Thereby, the semiconductor light emitting device 110 illustrated in FIGS. 1A and 1B is formed.

The characteristics of the semiconductor light emitting device 110 are explained below.

FIG. 2 is a graph illustrating the characteristics of a semiconductor light emitting device according to the first embodiment.

That is, FIG. 2 shows an example of the relationship between a current density Jc (a current density of electric current injected into a semiconductor layer) and a light emission efficiency Er in a semiconductor light emitting device and the horizontal axis represents a current density Jc and the vertical axis represents a light emission efficiency Er. Here, the light emission efficiency Er is illustrated as a value standardized by regarding the highest light emission efficiency obtained when the current density Jc is varied as one.

As shown in FIG. 2, in a semiconductor light emitting device, when the current density Jc increases from zero, the light emission efficiency Er also increases. Then, the light emission efficiency Er comes to be the maximum (light emission efficiency Er=1) when the current density Jc is a certain maximum efficiency current density 3m. Then, when the current density Jc comes to be larger than the maximum efficiency current density Jm, the light emission efficiency Er lowers. In this way, when the current density Jc increases excessively, the quantum efficiency lowers and the light emission efficiency Er also lowers.

In order to keep a high light emission efficiency Er, it is desirable that the current density Jc be controlled in a prescribed range. For example, the range where the light emission efficiency Er lowers by up to 5% from the maximum value 1 is set as to be acceptable. That is, the current density Jc is controlled so that the light emission efficiency Er may not be less than 0.95.

The cases where the light emission efficiency Er comes to be 0.95 are the cases where the current density Jc is a lower side current density value J1 on the side of a current density smaller than the maximum efficiency current density Jm and an upper side current density value J2 on the side of a large current density. In an appropriate current density range Jr2 ranging from the lower side current density value J1 to the upper side current density value J2, a high light emission efficiency Er (a light emission efficiency Er of not less than 0.95) is obtained. In an excessively small current density range Jr1 that is smaller than the lower side current density value J1, the current density Jc is excessively small and the light emission efficiency Er comes to be lower than 0.95. On the other hand, in an excessively large current density range Jr3 that is larger than the upper side current density value J2, the current density Jc is excessively large and the light emission efficiency Er comes to be lower than 0.95. In this way, by controlling the current density Jc of electric current flowing in the semiconductor light emitting device into the appropriate current density range Jr2, a high light emission efficiency Er is obtained.

Meanwhile, although the allowable range of the light emission efficiency Er is set at not less than 0.95 as an example in the above case, in conformity with the specification of a light emission efficiency Er to be obtained, the lower side current density value J1 and the upper side current density value J2 are determined and thereby the appropriate current density range Jr2 is determined appropriately.

FIGS. 3A to 3D are graphs illustrating the characteristics of a semiconductor light emitting device according to the first embodiment.

That is, FIGS. 3A, 3B, 3C, and 3D show the variations of the film thickness of a second electrode 50, the sheet resistance of the second electrode 50, the current density of electric current injected into a semiconductor layer, and a light emission efficiency in the X axis direction, respectively, and the horizontal axis in each of the figures represents a position x in the X axis direction. Then the vertical axes in FIGS. 3A, 3B, 3C, and 3D represent the thickness Tt of a second electrode 50, the sheet resistance Rs of the second electrode 50, the current density Jc of electric current injected into a semiconductor layer, and a light emission efficiency Er. Here, the light emission efficiency Er is illustrated as a value standardized by regarding the highest light emission efficiency obtained when the current density Jc is varied as one.

Figure 3A:
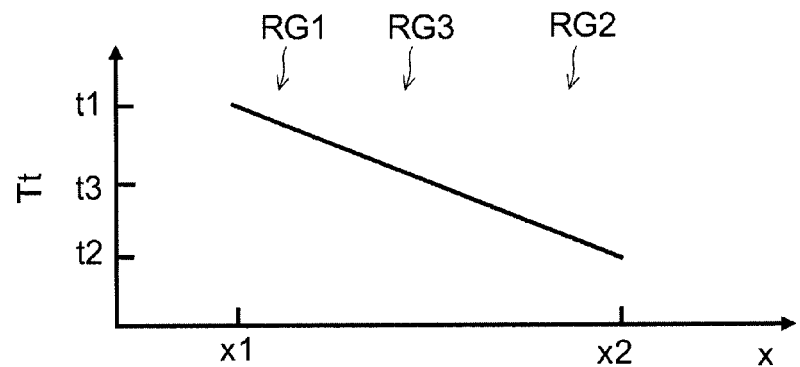
FIGS. 3A to 3D are graphs illustrating the characteristics of the semiconductor light emitting device according to the first embodiment.

As shown in FIG. 3A, in a semiconductor light emitting device 110 according to the embodiment, a first thickness t1 of a second electrode 50 at a first position x1 on the side of a pad layer 55 is larger than a second thickness t2 of the second electrode 50 at a second position x2 on the side of a first electrode 40. Then, the thickness Tt of the second electrode 50 decreases continuously from the first thickness t1 to the second thickness t2. That is, the thickness Tt decreases gradually from the first thickness t1 to the second thickness t2.

Figure 3B:
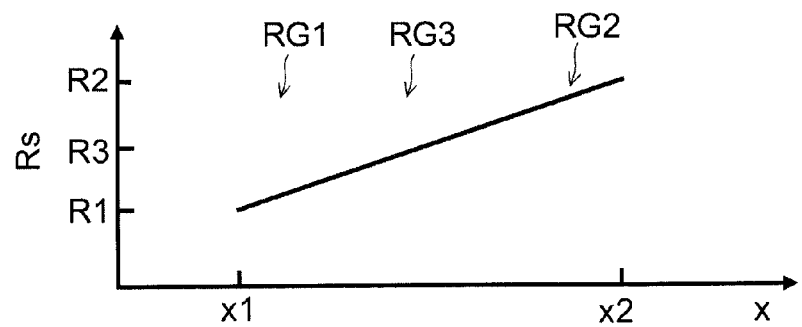

Consequently, as shown in FIG. 3B, the sheet resistance Rs of the second electrode 50 at the first position x1 (a first sheet resistance R1) comes to be lower than the sheet resistance Rs of the second electrode 50 at the second position x2 (a second sheet resistance R2). Then, the sheet resistance Rs of the second electrode 50 increases continuously from the first sheet resistance R1 to the second sheet resistance R2. That is, the sheet resistance Rs increases gradually. The first sheet resistance R1 is about 6 Ω/square (ohm/square) for example and the second sheet resistance R2 is 10 Ω/square for example.

Figure 3C:
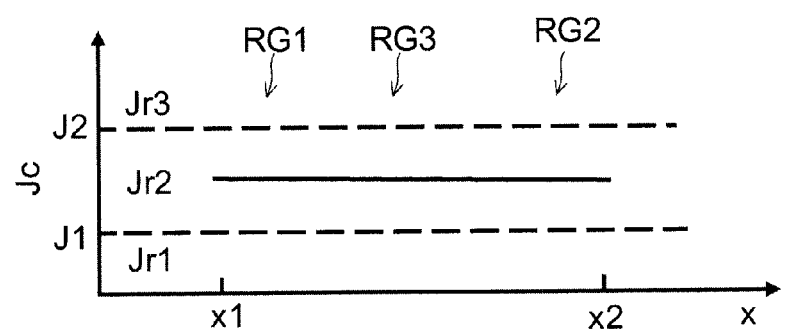

On this occasion, as shown in FIG. 3C, in the whole region ranging from the first position x1 to the second position x2, the current density Jc is controlled in an appropriate current density range Jr2 between a lower side current density value J1 and an upper side current density value J2.

If the sheet resistance Rs of the second electrode 50 is sufficiently low over the whole range of the second electrode 50 as it will be described later, in a region where the second electrode 50 contacting a second semiconductor layer 20 of the p-type and the first electrode 40 contacting a first semiconductor layer 10 of the n-type come close to each other, electric current is injected mainly into the semiconductor layers, light is emitted locally only at the part, light cannot be emitted over the whole area of the device, and efficiency lowers. In contrast, in the semiconductor light emitting device 110 according to the embodiment, by increasing the sheet resistance Rs of the second electrode 50 along the direction going from the pad layer 55 toward the first electrode 40, it is possible to inject positive holes from the second electrode 50 to a light emitting layer 30 uniformly over the whole area ranging from a region close to the pad layer 55 to a region close to the first electrode 40 and inhibit an excessively large injection current density. On this occasion, since the sheet resistance Rs of the second electrode 50 continuously and gradually increases, it is possible to inhibit a local excessively large injection current density caused by discontinuous change.

Figure 3D:
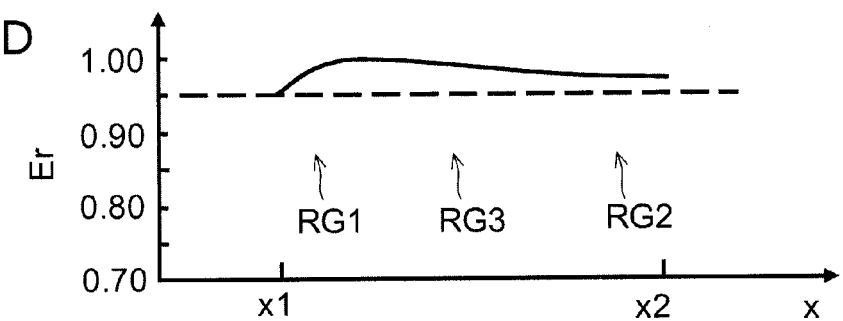

Thereby, as shown in FIG. 3D, it is possible to keep a light emission efficiency Er high in the whole range ranging from the first position x1 to the second position x2. In this example, the light emission efficiency Er is not less than 0.95.

In this way, with the semiconductor light emitting device 110, it is possible to equalize the positive hole current injected from the second electrode 50 to the light emitting layer 30 in the inside of the device, inhibit an excessively large injection current density, and improve efficiency.

FIGS. 4A to 4E are schematic views illustrating the characteristics of a semiconductor light emitting device of a first reference example.

Figure 4A:
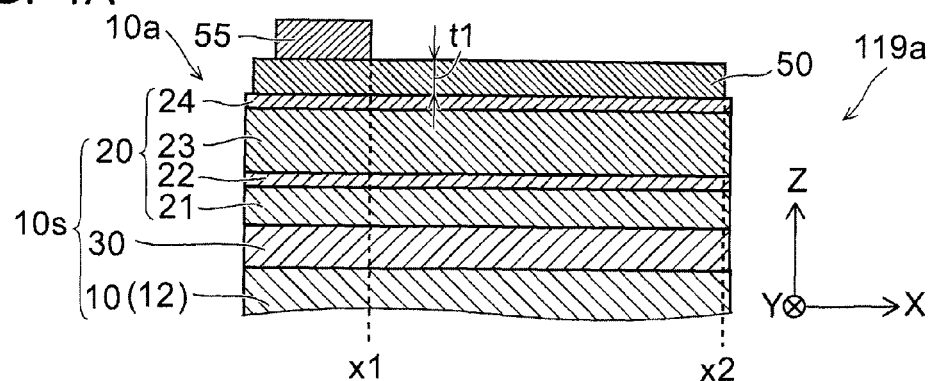
FIGS. 4A to 4E are schematic views illustrating the characteristics of a semiconductor light emitting device of a first reference example.

That is, FIG. 4A is a schematic sectional view illustrating the configuration of a semiconductor light emitting device 119a of the first reference example. Here, FIG. 4A is drawn in the state where a part of the semiconductor light emitting device 119a on the side of the first semiconductor layer 10 is omitted but the configuration of the part is similar to that of the semiconductor light emitting device 110 according to the embodiment. FIGS. 4B, 4C, 4D, and 4E are graphs illustrating the characteristics of the semiconductor light emitting device 119a and corresponding to FIGS. 3A, 3B, 3C, and 3D, respectively.

As shown in FIG. 4A, in the semiconductor light emitting device 119a of the first reference example, the thickness of a second electrode 50 is constant. Then, the thickness is the same as the first thickness t1 of the second electrode 50 in the semiconductor light emitting device 110 for example.

Figure 4B:
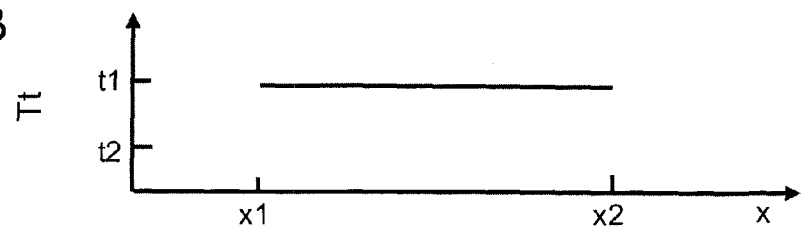

That is, as shown in FIG. 4B, in the semiconductor light emitting device 119a, the thickness Tt of the second electrode 50 is the first thickness t1 and constant from a first position x1 to a second position x2 and large in the whole area ranging from the first position x1 to the second position x2.

Figure 4C:

Consequently, as shown in FIG. 4C, the sheet resistance Rs of the second electrode 50 is a first sheet resistance R1 and constant from the first position x1 to the second position x2 and low in the whole area ranging from the first position x1 to the second position x2.

Figure 4D:
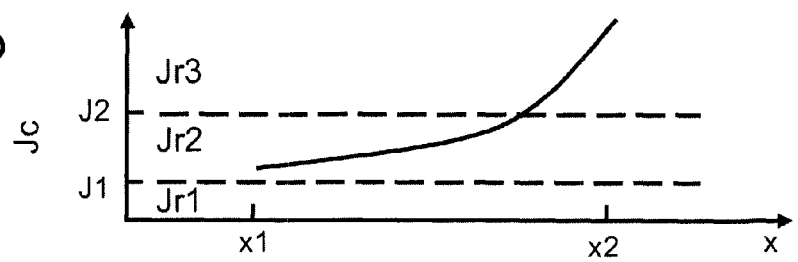

On this occasion, as shown in FIG. 4D, the current density Jc increases as the position shifts from the first position x1 to the second position x2. In the vicinity of the second position x2 in the vicinity of a first electrode 40 in particular, the current density Jc increases rapidly. This is because: since the sheet resistance Rs of the second electrode 50 is low over the whole area, positive holes are likely to be injected over the whole area, but the electrons injected from the first electrode 40 do not spread in the whole area of the light emitting device, electric current is injected mainly into semiconductor layers in the region where the second electrode 50 contacting a second semiconductor layer 20 of the p-type and the first electrode 40 contacting a first semiconductor layer 10 of the n-type come close to each other, and the injected electric current is small in the region distant from the regions adjacent to each other; and thereby the current density Jc takes a value in an excessively large current density range Jr3 particularly in the vicinity of the second position x2.

Figure 4E:
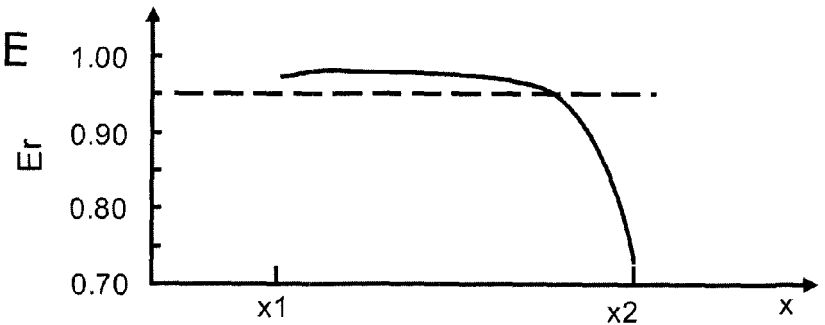

As a result, as shown in FIG. 4E, a light emission efficiency Er lowers rapidly in the region in the vicinity of the second position x2. In this example, although a relatively high light emission efficiency Er is obtained in the vicinity of a pad layer 55, on the side of the first electrode 40, the light emission efficiency Er lowers considerably and it is impossible to obtain a high light emission efficiency over the whole area ranging from the first position x1 to the second position x2. Consequently, the light emission efficiency of the semiconductor light emitting device 119a is low.

FIGS. 5A to 5E are schematic views illustrating the characteristics of a semiconductor light emitting device of a second reference example.

Figure 5A:
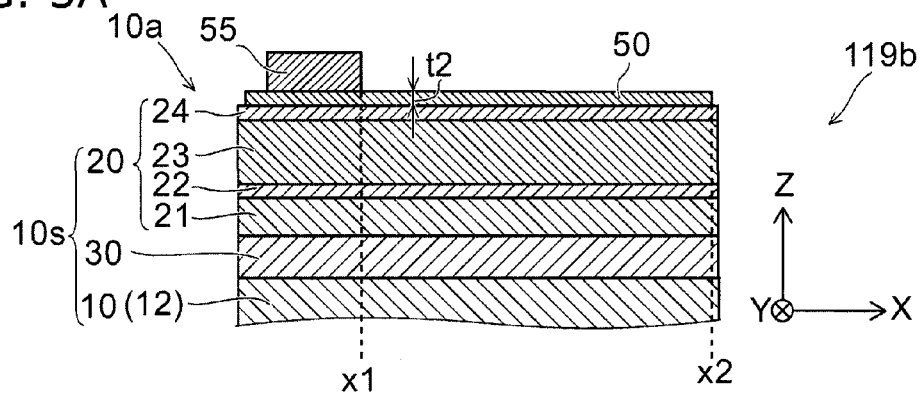
FIGS. 5A to 5E are schematic views illustrating the characteristics of a semiconductor light emitting device of a second reference example.

That is, FIG. 5A is a schematic sectional view illustrating the configuration of a semiconductor light emitting device 119b of the second reference example. Here, in FIG. 5A, although a part of the semiconductor light emitting device 119b on the side of a first semiconductor layer 10 is omitted, the part is similar to that of the semiconductor light emitting device 110. FIGS. 5B, 5C, 5D, and 5E are graphs illustrating the characteristics of the semiconductor light emitting device 119b and corresponding to FIGS. 3A, 3B, 3C, and 3D, respectively.

As shown in FIG. 5A, in the semiconductor light emitting device 119b of the second reference example, the thickness of a second electrode 50 is constant. Then, the thickness is the same as the second thickness t2 of the second electrode 50 in the semiconductor light emitting device 110 for example.

Figure 5B:
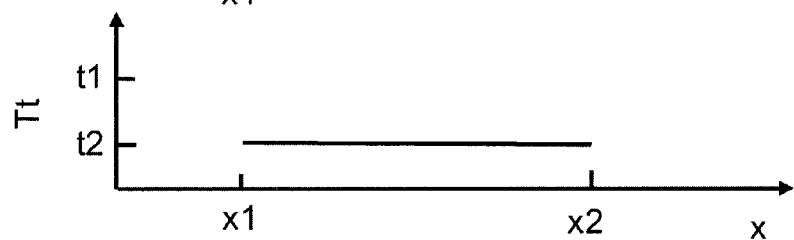

That is, as shown in FIG. 5B, in the semiconductor light emitting device 119b, the thickness Tt of the second electrode 50 is a second thickness t2 and constant from a first position x1 to a second position x2 and small in the whole area ranging from the first position x1 to the second position x2.

Figure 5C:
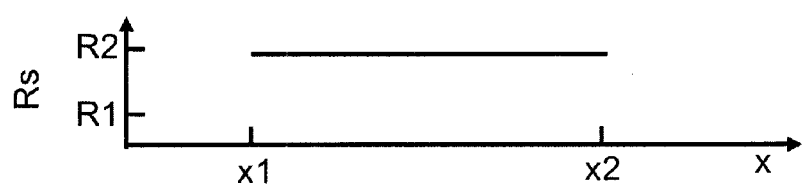

Consequently, as shown in FIG. 5C, the sheet resistance Rs of the second electrode 50 is a second sheet resistance R2 and constant from the first position x1 to the second position x2 and high in the whole area ranging from the first position x1 to the second position x2.

Figure 5D:
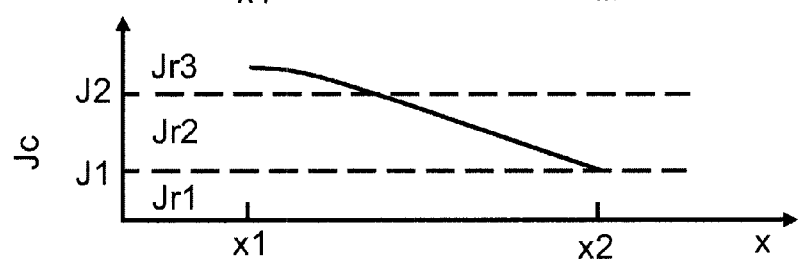

On this occasion, as shown in FIG. 5D, a current density Jc decreases as the position shifts along the direction from the first position x1 to the second position x2. This is because, since the sheet resistance Rs of the second electrode 50 is high over the whole area, the quantity of positive holes injected from the second electrode 50 to a light emitting layer 30 increases in the vicinity of a pad layer 55 and the quantity injected in the vicinity of the first electrode 40 decreases.

Consequently, the current density Jc takes a value in an excessively large current density range Jr3 in the vicinity of the first position x1.

Figure 5E:
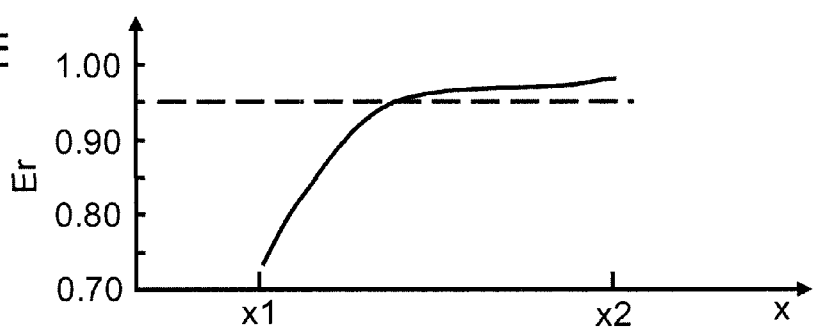

As a result, as shown in FIG. 5E, a light emission efficiency Er lowers rapidly in the region in the vicinity of the first position x1. That is, although a relatively high light emission efficiency Er is obtained in the vicinity of the first electrode 40, on the side of the pad layer 55, the light emission efficiency Er lowers considerably and it is impossible to obtain a high light emission efficiency over the whole area ranging from the first position x1 to the second position x2. Consequently, the light emission efficiency of the semiconductor light emitting device 119b is low.

FIGS. 6A to 6E are schematic views illustrating the characteristics of a semiconductor light emitting device of a third reference example.

Figure 6A:
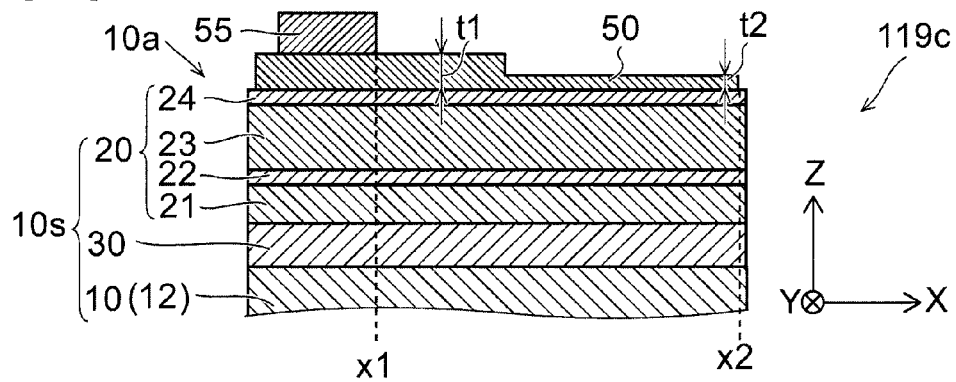
FIGS. 6A to 6E are schematic views illustrating the characteristics of a semiconductor light emitting device of a third reference example.

That is, FIG. 6A is a schematic sectional view illustrating the configuration of a semiconductor light emitting device 119c of the third reference example. Here, in FIG. 6A, although a part of the semiconductor light emitting device 119c on the side of a first semiconductor layer 10 is omitted, the part is similar to that of the semiconductor light emitting device 110. FIGS. 6B, 6C, 6D, and 6E are graphs illustrating the characteristics of the semiconductor light emitting device 119c and corresponding to FIGS. 3A, 3B, 3C, and 3D, respectively.

As shown in FIG. 6A, in the semiconductor light emitting device 119c of the third reference example, the thickness of a second electrode 50 varies in the shape of a single step. That is, two regions of a region where a sheet resistance Rs is low and a region where a sheet resistance Rs is high are provided in the second electrode 50. Then, the region where the sheet resistance Rs is low is located on the side of a pad layer 55 and the region where the sheet resistance Rs is high is located on the side of a first electrode 40. Here, the configuration is similar to that described in Patent Literature 1.

Figure 6B:
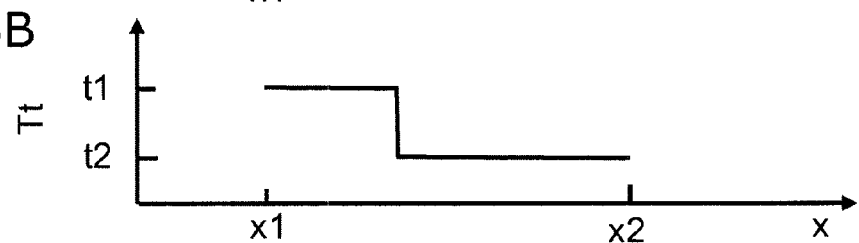

That is, as shown in FIG. 6B, in the semiconductor light emitting device 119c, the thickness Tt of the second electrode 50 is a first thickness t1 at a first position x1, is a second thickness t2 at a second position x2, and changes rapidly through the single step at an intermediate position between the first position x1 and the second position x2. That is, in the semiconductor light emitting device 119c, the thickness Tt of the second electrode 50 changes discontinuously.

Figure 6C:
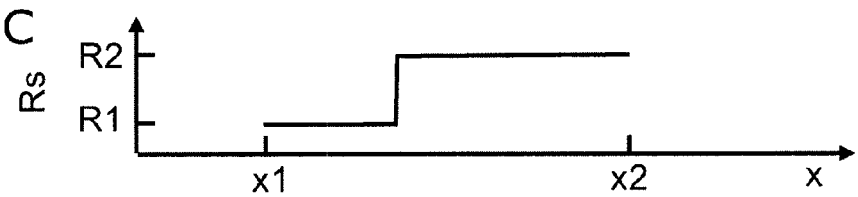

Consequently, as shown in FIG. 6C, the sheet resistance Rs of the second electrode 50 is a first sheet resistance R1 at the first position x1 and a second sheet resistance R2 at the second position x2, and changes rapidly through the single step at an intermediate position between the first position x1 and the second position x2. That is, in the semiconductor light emitting device 119c, the sheet resistance Rs of the second electrode 50 changes discontinuously.

Figure 6D:
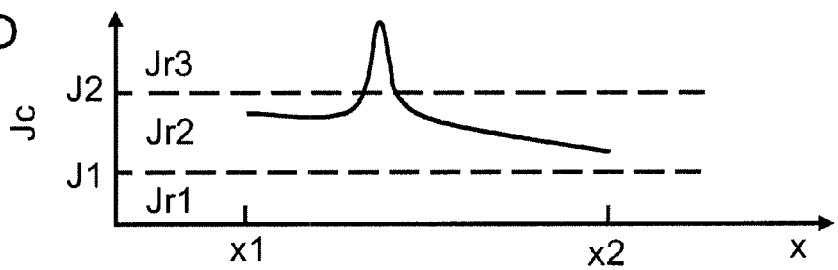

On this occasion, as shown in FIG. 6D, at an intermediate position between the first position x1 and the second position x2 where the sheet resistance Rs changes discontinuously, a current density Jc increases locally. This is because, since the sheet resistance Rs of the second electrode 50 increases discontinuously along the direction from a pad layer 55 to a first electrode 40, positive holes concentrate locally at the position and are injected along the direction from the second electrode 50 to a light emitting layer 30. Consequently, the current density Jc increases locally at an intermediate position between the first position x1 and the second position x2 and takes a value in an excessively large current density range Jr3.

Figure 6E:
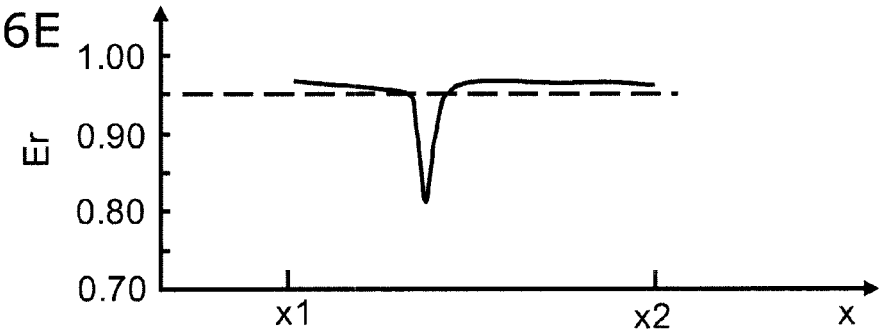

As a result, as shown in FIG. 6E, a light emission efficiency Er lowers rapidly and locally at an intermediate position between the first position x1 and the second position x2. That is, in this example, although a relatively high light emission efficiency Er is obtained in the regions in the vicinities of the first electrode 40 and the pad layer 55, the light emission efficiency Er lowers considerably at an intermediate position between the first position x1 and the second position x2 where the sheet resistance Rs of the second electrode 50 changes discontinuously, and it is impossible to obtain a high light emission efficiency over the whole area ranging from the first position x1 to the second position x2. Consequently, the light emission efficiency of the semiconductor light emitting device 119c is low.

In contrast, as explained in reference to FIGS. 3A to 3D, in the semiconductor light emitting device 110 according to the embodiment, since the sheet resistance Rs of the second electrode 50 increases continuously and gradually along the direction going from the first position x1 toward the second position x2, it is possible to inhibit an excessively large injection current density in the whole area between the first position x1 and the second position x2 and as a result a high light emission efficiency Er is obtained. Consequently, the light emission efficiency of the semiconductor light emitting device 110 is higher than any of the semiconductor light emitting devices 119a to 119c of the first to third reference examples.

Figure 7:
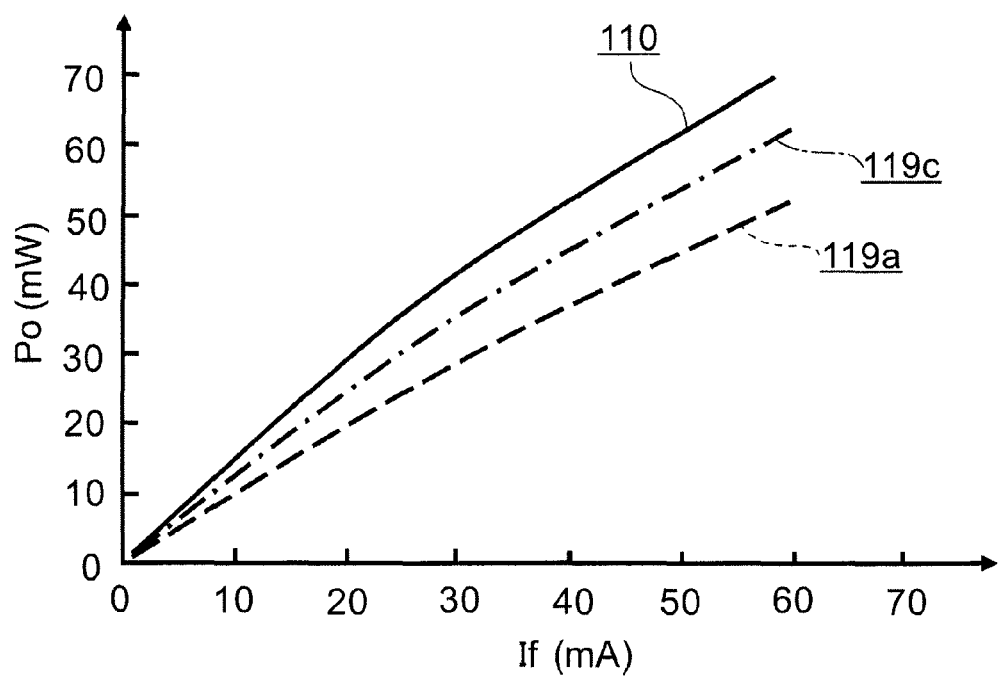
FIG. 7 is a graph illustrating the characteristics of the semiconductor light emitting device according to the first embodiment and the semiconductor light emitting devices of the reference examples.

FIG. 7 is a graph illustrating the characteristics of the semiconductor light emitting device according to the first embodiment and the semiconductor light emitting devices of the reference examples.

That is, FIG. 7 illustrates the characteristics of the semiconductor light emitting device 110 according to the embodiment and the semiconductor light emitting devices 119a and 119c of the first and third reference examples. The horizontal axis represents an electric current If and the vertical axis represents a light output Po.

As shown in FIG. 7, the light output Po of the semiconductor light emitting device 119a of the first reference example is low. The light output Po of the semiconductor light emitting device 119c of the third reference example improves and is better than that of the semiconductor light emitting device 119a but is still insufficient.

In contrast, as shown in FIG. 7, the light output Po of the semiconductor light emitting device 110 according to the embodiment is still higher than the light output Po of the semiconductor light emitting device 119c of the third reference example.

Meanwhile, the light output Po of the semiconductor light emitting device 119b of the second reference example is similar to that of the semiconductor light emitting device 119a of the first reference example and is lower than the light output Po of the semiconductor light emitting device 119c of the third reference example.

In this way, with the semiconductor light emitting device 110 according to the embodiment, a high efficiency semiconductor light emitting device wherein the distribution of an injection current density is equalized and an excessively large injection current density is inhibited can be provided.

Further, since the mobility of a positive hole is lower than that of an electron, the effect of equalizing the injection of electric charge by continuously controlling the sheet resistance of a second electrode 50 is larger in the case of a positive hole than in the case of an electron. Consequently, in the semiconductor light emitting device according to the embodiment, it is desirable that the first conductivity type be an n-type and the second conductivity type be a p-type. Thereby, a larger effect can be obtained. Note that effect of similar tendency can be obtained even when the first conductivity type is a p-type and the second conductivity type is an n-type.

Although the sheet resistance Rs of the second electrode 50 changes linearly between the first position x1 and the second position x2 in the characteristics illustrated in FIG. 3B, the embodiment is not limited to the case and the change of the sheet resistance Rs can be modified variously.

FIGS. 8A to 8J are graphs illustrating the characteristics of other semiconductor light emitting devices according to the first embodiment.

That is, those figures show the examples of various characteristics of the sheet resistance Rs of a second electrode 50 in each of semiconductor light emitting devices 110a to 110j according to the embodiment. The horizontal axis represents a position x in the X axis direction and the vertical axis represents the sheet resistance Rs of a second electrode 50.

Figure 8A:
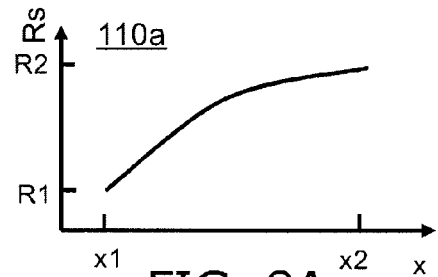
FIGS. 8A to 8J are graphs illustrating the characteristics of other semiconductor light emitting devices according to the first embodiment.

As shown in FIG. 8A, in a semiconductor light emitting device 110a, the increase rate of the sheet resistance Rs of a second electrode 50 to a position x is large in the vicinity of a first position x1 and small in the vicinity of a second position x2. That is, the increase rate of the sheet resistance Rs in the X axis direction lowers in the X axis direction.

Figure 8B:
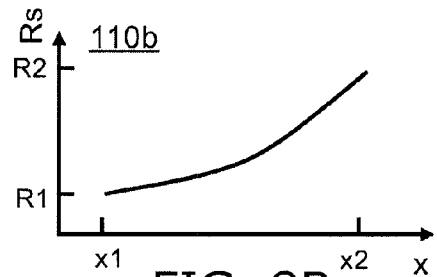

As shown in FIG. 8B, in a semiconductor light emitting device 110b, the increase rate of a sheet resistance Rs to a position x is small in the vicinity of a first position x1 and large in the vicinity of a second position x2. That is, the increase rate of the sheet resistance Rs along the X axis direction rises along the X axis direction.

Figure 8C:
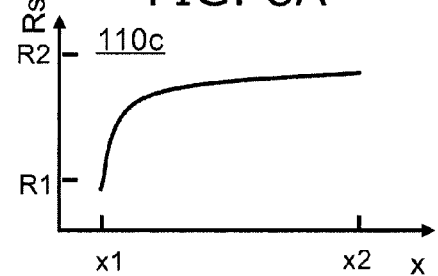

As shown in FIG. 8C, in a semiconductor light emitting device 110c, the increase rate of a sheet resistance Rs to a position x is very large in the vicinity of a first position x1 and, from an intermediate region between the first position x1 and a second position x2 to the second position x2, the increase rate is very small and the sheet resistance Rs is nearly constant.

Figure 8D:
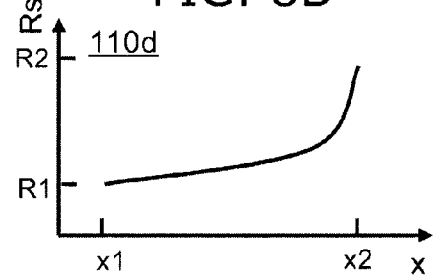

As shown in FIG. 8D, in a semiconductor light emitting device 110d, the increase rate of a sheet resistance Rs to a position x is small from a first position x1 to an intermediate region between the first position x1 and a second position x2, and the sheet resistance Rs is nearly constant. Then the increase rate increases rapidly in the vicinity of the second position x2.

Figure 8E:
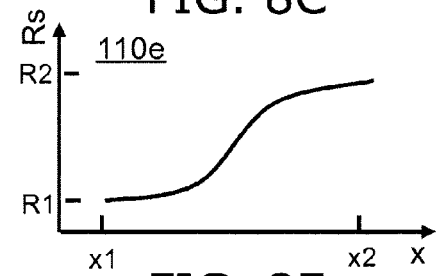

As shown in FIG. 8E, in a semiconductor light emitting device 110e, the increase rate of a sheet resistance Rs to a position x is small in the vicinities of a first position x1 and a second position x2 and large in an intermediate region between the first position x1 and the second position x2.

Figure 8F:
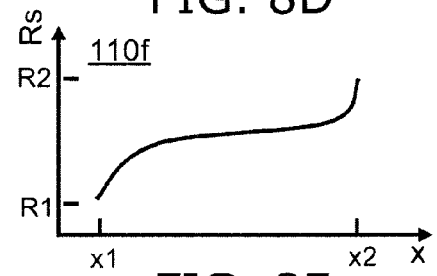

As shown in FIG. 8F, in a semiconductor light emitting device 110f, the increase rate of a sheet resistance Rs to a position x is large in the vicinities of a first position x1 and a second position x2 and small in an intermediate region.

In this way, in the embodiments, the increase rate of a sheet resistance Rs along the X axis direction can be changed along the X axis direction.

Figure 8G:
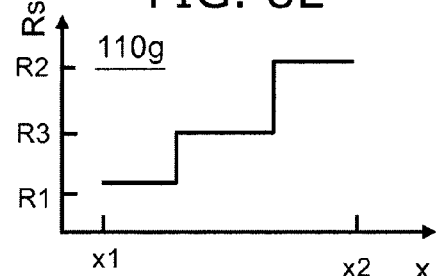

As shown in FIG. 8G, in a semiconductor light emitting device 110g, a sheet resistance Rs increases at two steps along the direction from a first position x1 to a second position x2. That is, a first sheet resistance R1 of a second electrode 50 in a first region RG1 close to a pad layer 55 is lower than a second sheet resistance R2 of the second electrode 50 in a second region RG2 closer to a first electrode 40 than the first region RG1 and a third sheet resistance R3 of the second electrode 50 in a third region RG3 between the first region RG1 and the second region RG2 is higher than the first sheet resistance R1 and lower than the second sheet resistance R2. In this way, even when a sheet resistance Rs changes at plural steps, the sheet resistance Rs increases gradually and is regarded as "changing continuously". Inversely, when a sheet resistance Rs changes at a single step as illustrated in FIG. 6C, the sheet resistance Rs is regarded as "changing discontinuously". Consequently, the characteristics illustrated in FIG. 8G are regarded as "continuously changing" characteristics.

Figure 8H:
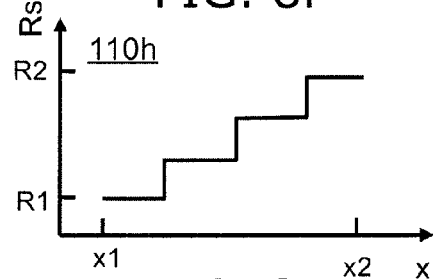

As shown in FIG. 8H, in a semiconductor light emitting device 110h, a sheet resistance Rs increases at three steps along the direction from a first position x1 to a second position x2. That is, this case corresponds to the case where two intermediate regions (for example, a third region RG3) exist. In this way, the sheet resistance Rs may change at three or more steps.

Figure 8I:
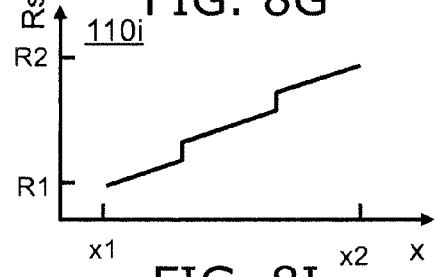

As shown in FIG. 8i, in a semiconductor light emitting device 110i, a sheet resistance Rs increases at a nearly constant change rate along the direction from a first position x1 to a second position x2 and changes stepwise at two steps. In this way, the change rate of the sheet resistance Rs is nearly constant and parts where change rates are different from each other may exist locally between the first position x1 and the second position x2.

Figure 8J:
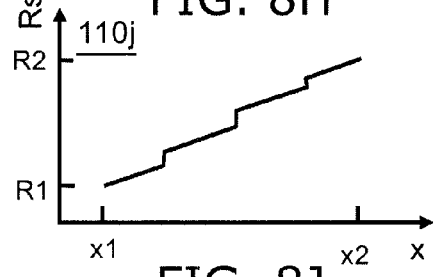

As shown in FIG. 8j, in a semiconductor light emitting device 110j, a sheet resistance Rs increases at a nearly constant change rate along the direction from a first position x1 to a second position x2 and changes stepwisely at three steps. In this way, even when the change rate of the sheet resistance Rs is nearly constant, three or more parts where change rates are different from each other may exist locally between the first position x1 and the second position x2.

As stated above, the sheet resistance Rs of a second electrode 50 in each of the semiconductor light emitting devices 110 and 110a to 110j according to the embodiment can continuously increase in various states along the direction going from a pad layer 55 (for example, a first position x1) toward a first electrode 40 (for example, a second position x2).

That is, in a second electrode 50, not only two regions of a first region RG1 where a sheet resistance Rs is low and a second region RG2 where a sheet resistance Rs is high are provided but also a third region RG3 having intermediate characteristics may be provided between the first region RG1 and the second region RG2.

The characteristics on the change of a sheet resistance Rs illustrated in FIGS. 8A to 8J are determined appropriately so that an excessively large current density may be inhibited on the basis of pattern shapes of a second electrode 50, a pad layer 55, a first electrode 40, and a first electrode pad layer 45 viewed along the Z axis direction, the value of a sheet resistance, contact resistances and ohmic characteristics to a first semiconductor layer 10 and a second semiconductor layer 20, a pattern shape viewed along the Z axis direction and electrical characteristics of a stacked structure body 10s, an intended light emission efficiency and operating conditions, and others.

Examples of changing the thickness of a second electrode 50 in order to realize the characteristics of the change of a sheet resistance Rs illustrated in each of FIGS. 8A to 8J are explained hereunder.

FIGS. 9A to 9J are graphs illustrating the characteristics of other semiconductor light emitting devices according to the first embodiment.

That is, those figures show the examples of various characteristics of the thickness Tt of a second electrode 50 in each of semiconductor light emitting devices. The horizontal axis represents a position x in the X axis direction and the vertical axis represents the thickness Tt of a second electrode 50. The characteristics on a thickness Tt illustrated in FIGS. 9A to 9J correspond to the characteristics of a sheet resistance Rs illustrated in FIGS. 8A to 8J, respectively.

Figure 9A:
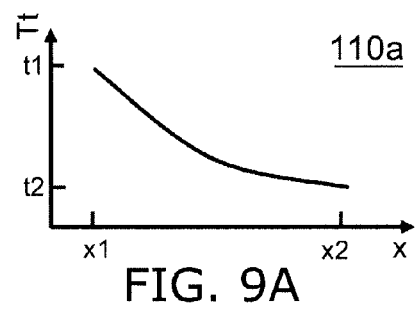
FIGS. 9A to 9J are graphs illustrating the characteristics of other semiconductor light emitting devices according to the first embodiment.

As shown in FIG. 9A, in a semiconductor light emitting device 110a, the decrease rate of a thickness Tt to a position x is large in the vicinity of a first position x1 and small in the vicinity of a second position x2. Here, a change rate is defined as an increase rate when the change rate is positive and the absolute value of a change rate is defined as a decrease rate when the change rate is negative. In this way, the decrease rate of a thickness Tt can lower along the X axis direction.

Figure 9B:
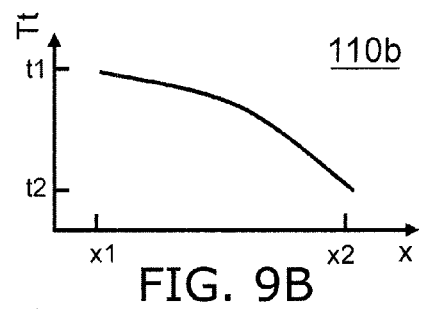

As shown in FIG. 9B, in a semiconductor light emitting device 110b, the decrease rate of a thickness Tt to a position x is small in the vicinity of a first position x1 and large in the vicinity of a second position x2. In this way, the decrease rate of the thickness Tt can rise along the X axis direction.

Figure 9C:
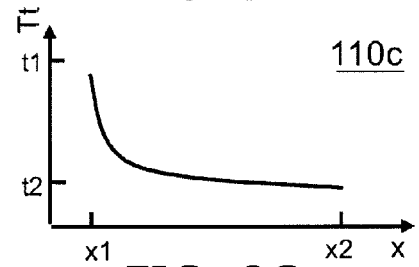

As shown in FIG. 9C, in a semiconductor light emitting device 110c, the decrease rate of a thickness Tt to a position x is very large in the vicinity of a first position x1 and, from an intermediate region between the first position x1 and a second position x2 to the second position x2, is very small and the thickness Tt is nearly constant.

Figure 9D:
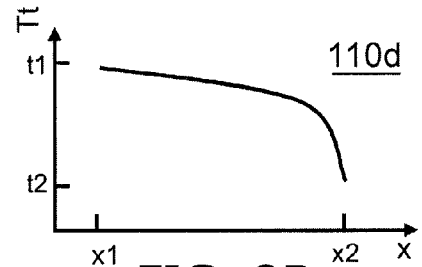

As shown in FIG. 9D, in a semiconductor light emitting device 110d, the decrease rate of a thickness Tt to a position x is small from a first position x1 to an intermediate region between the first position x1 and a second position x2, and the thickness Tt is nearly constant. Then the decrease rate increases rapidly in the vicinity of the second position x2.

Figure 9E:
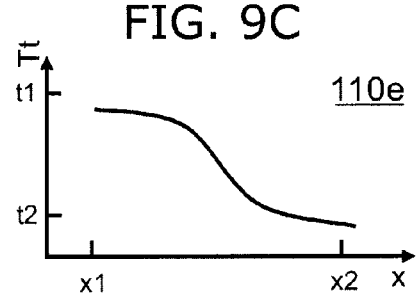

As shown in FIG. 9E, in a semiconductor light emitting device 110e, the decrease rate of a thickness Tt to a position x is small in the vicinities of a first position x1 and a second position x2 and large in an intermediate region.

Figure 9F:
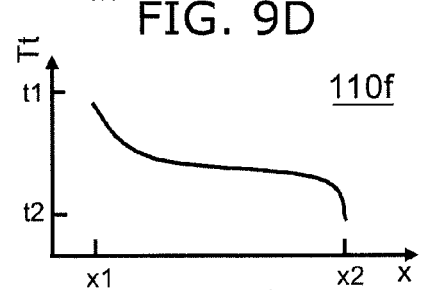

As shown in FIG. 9F, in a semiconductor light emitting device 110f, the decrease rate of a thickness Tt to a position x is large in the vicinities of a first position x1 and a second position x2 and small in an intermediate region.

In this way, the decrease rate of the thickness Tt can change along the X axis direction.

Figure 9G:
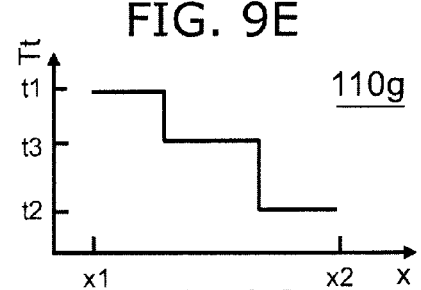

As shown in FIG. 9G, in a semiconductor light emitting device 110g, a thickness Tt decreases at two steps along the direction from a first position x1 to a second position x2. That is, a first thickness t1 of a second electrode 50 in a first region RG1 close to a pad layer 55 is larger than a second thickness t2 of the second electrode 50 in a second region RG2 closer to a first electrode 40 than the first region RG1 and a third thickness t3 of the second electrode 50 in a third region RG3 between the first region RG1 and the second region RG2 is smaller than the first thickness t1 and larger than the second thickness t2. In this way, even when a thickness Tt changes at plural steps, the thickness Tt increases gradually and is regarded as "changing continuously". Inversely, when a thickness Tt changes at a single step as illustrated in FIG. 6B, the thickness Tt is regarded as "changing discontinuously". Consequently, the characteristics illustrated in FIG. 9G are regarded as "continuously changing" characteristics.

Figure 9H:
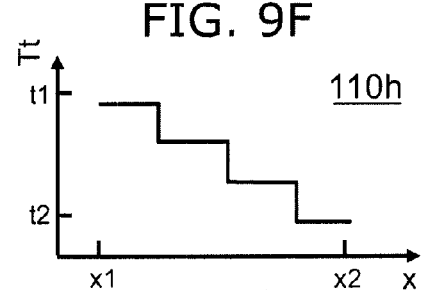

As shown in FIG. 9H, in a semiconductor light emitting device 110h, a thickness Tt decreases at three steps along the direction from a first position x1 to a second position x2. That is, this case corresponds to the case where two intermediate regions (for example, a third region RG3) exist. In this way, the thickness Tt may change at three or more steps.

Figure 9I:
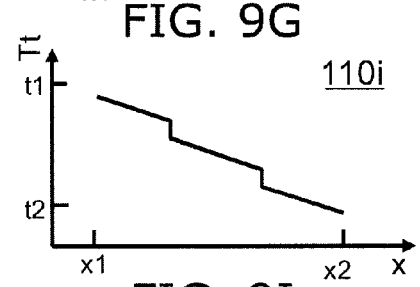

As shown in FIG. 9I, in a semiconductor light emitting device 110i, a thickness Tt decreases at a nearly constant change rate along the direction from a first position x1 to a second position x2 and changes stepwisely at two steps. In this way, even when the change rate of a thickness Tt is nearly constant, parts where change rates are different from each other may exist locally between the first position x1 and the second position x2.

Figure 9J:
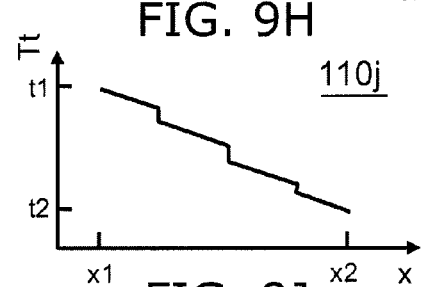

As shown in FIG. 9J, in a semiconductor light emitting device 110j, a thickness Tt decreases at a nearly constant change rate along the direction from a first position x1 to a second position x2 and changes stepwisely at three steps. In this way, even when the change rate of a thickness Tt is nearly constant, three or more parts where change rates are different from each other may exist locally between the first position x1 and the second position x2.

As stated above, the thickness Tt of a second electrode 50 in the semiconductor light emitting device 110 according to the embodiment can continuously decrease in various states along the direction going from a pad layer 55 (for example, a first position x1) toward a first electrode 40 (for example, a second position x2).

That is, in a second electrode 50, not only two regions of a first region RG1 where a thickness Tt is small and a second region RG2 where a thickness Tt is large are provided but also a third region RG3 having intermediate characteristics may be provided between the first region RG1 and the second region RG2.

The characteristics of the change of a thickness Tt illustrated in FIGS. 9A to 9J can be determined appropriately on the basis of various characteristics of a semiconductor light emitting device in the same way as the characteristics of the change of a sheet resistance Rs.

Figure 10A:
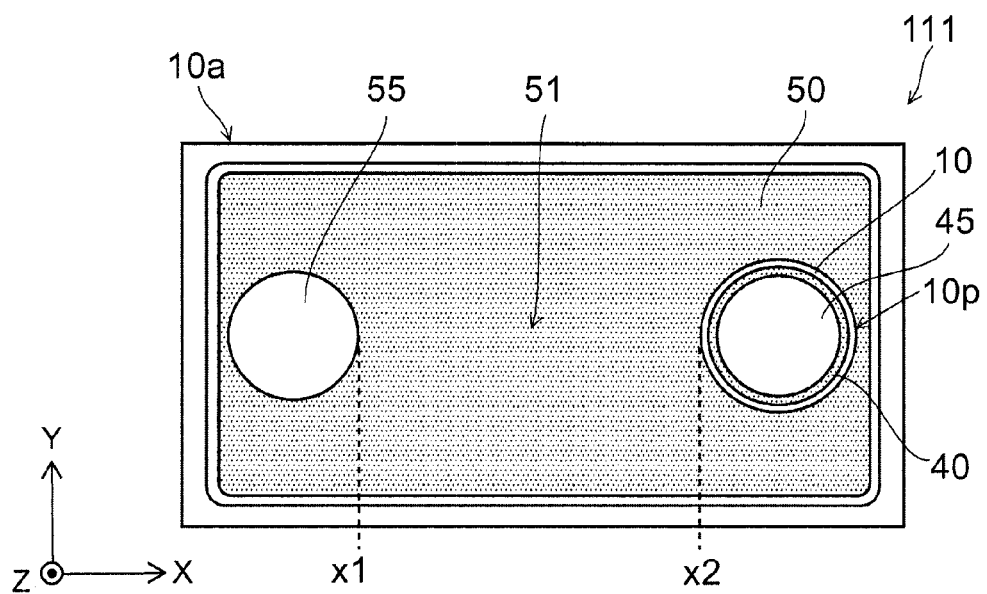
FIGS. 10A and 10B are schematic plan views illustrating the configurations of other semiconductor light emitting devices according to the first embodiment.
Figure 10B:
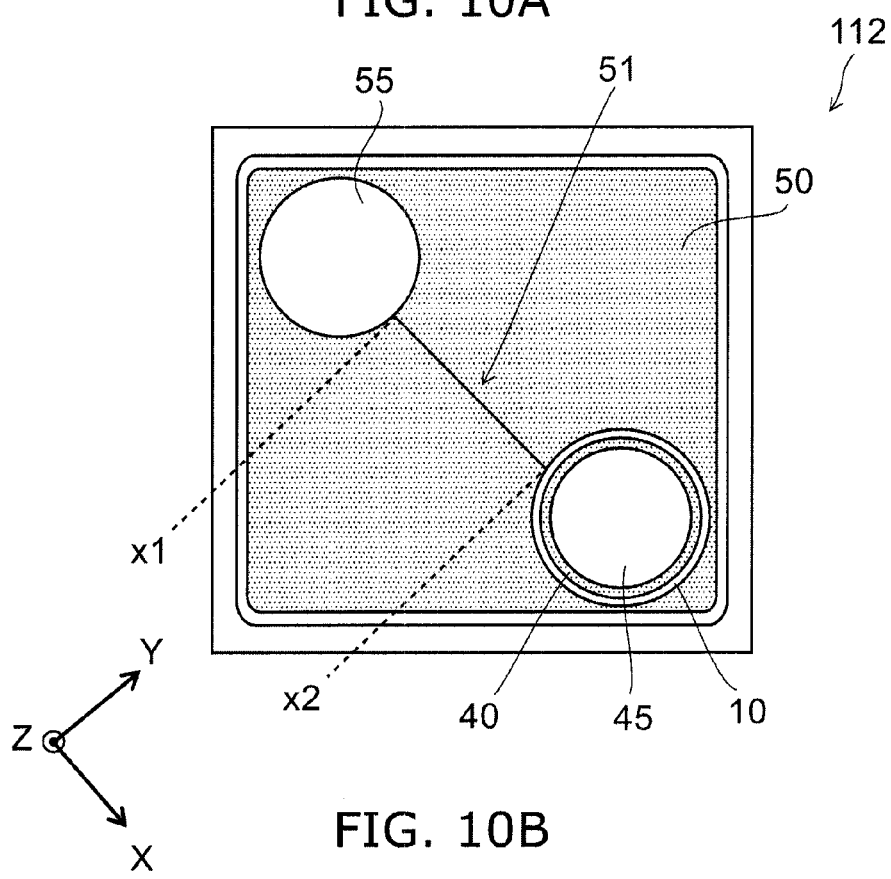

FIGS. 10A and 10B are schematic plan views illustrating the configurations of other semiconductor light emitting devices according to the first embodiment.

As shown in FIG. 10A, in another semiconductor light emitting device 111 according to the embodiment, a part (the first portion 10p) of a first semiconductor layer 10 exposed on the side of a major surface 10a of a stacked structure body 10s is surrounded by a second semiconductor layer 20. Then, when viewed along the Z axis direction (the stacking direction of the stacked structure body 10s), the first electrode 40 is surrounded by a second electrode 50. That is, the pattern shape of the second electrode 50 has an opening and, in the inside of the opening, the exposed part (the first portion 10p) of the first semiconductor layer 10 is located and, in the inside of the opening further, the first electrode 40 is located. Other than that can be regarded as similar to the semiconductor light emitting device 110 and hence explanations are omitted.

On this occasion too, the second electrode 50 has a region 51 between a pad layer 55 and the first electrode 40 and, in the region 51, the sheet resistance Rs of the second electrode 50 increases continuously along the direction going from the pad layer 55 toward the first electrode 40. That is, the sheet resistance Rs increases gradually.

As shown in FIG. 10B, in still another semiconductor light emitting device 112 according to the embodiment, the shape of a stacked structure body 10s viewed along the Z axis direction is a rectangle, a first electrode 40 is located at a corner of the rectangle, and a pad layer 55 is located at the corner diagonal to the corner where the first electrode 40 is located. On this occasion too, a part (the first portion 10p) of a first semiconductor layer 10 exposed on the side of a major surface 10a is surrounded by a second semiconductor layer 20 and, when viewed along the Z axis direction, the first electrode 40 is surrounded by a second electrode 50. Other than that can be regarded as similar to the semiconductor light emitting device 110 and hence explanations are omitted.

On this occasion too, the second electrode 50 has a region 51 between the pad layer 55 and the first electrode 40 and, in the region 51, the sheet resistance Rs of the second electrode 50 increases continuously along the direction going from the pad layer 55 toward the first electrode 40. That is, the sheet resistance Rs increases gradually.

In the cases of the semiconductor light emitting devices 111 and 112 too, the sheet resistance Rs of the second electrode 50 can be changed by changing the thickness Tt of the second electrode 50 for example.

In this way, in a semiconductor light emitting device according to the embodiment, the arrangement and the pattern shapes (pattern shapes viewed along the Z axis direction) of a first electrode 40, a second electrode 50, and a pad layer 55 are variously changeable.

Figure 11:
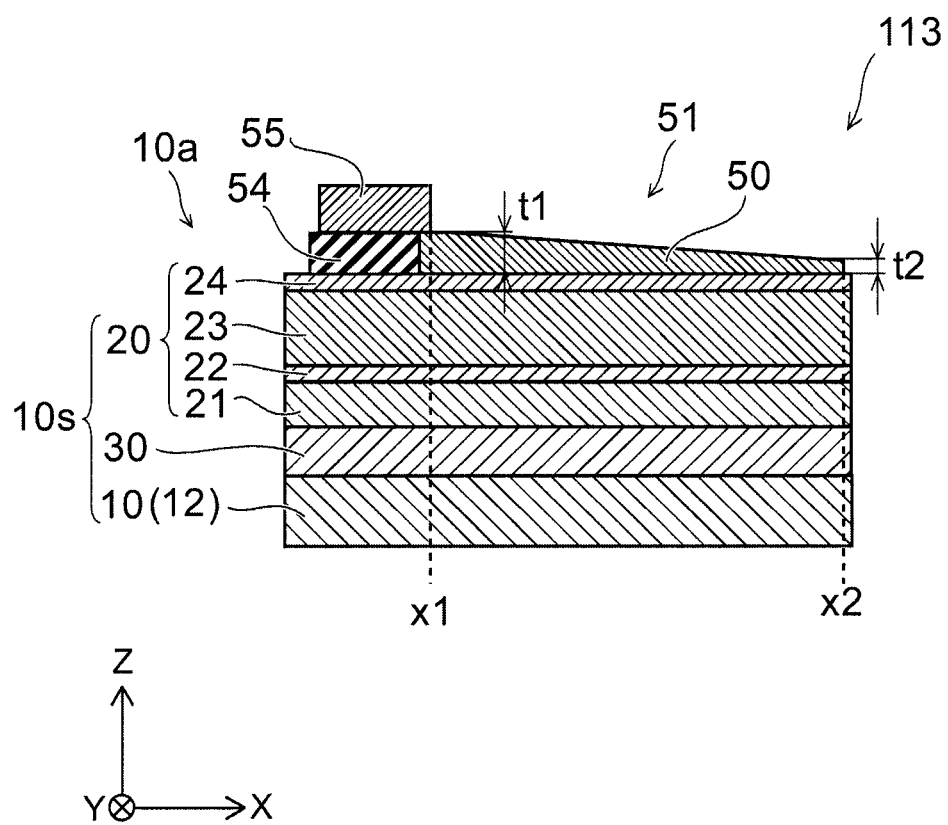
FIG. 11 is a schematic sectional view illustrating the configuration of another semiconductor light emitting device according to the first embodiment.

FIG. 11 is a schematic sectional view illustrating the configuration of another semiconductor light emitting device according to the first embodiment.

That is, FIG. 11 is a sectional view corresponding to the view taken along A-A' line in FIG. 1A. Here, although a part of a semiconductor light emitting device 113 according to the embodiment on the side of a first semiconductor layer 10 is omitted in FIG. 11, the part has the same configuration as the semiconductor light emitting device 110 according to the embodiment.

As shown in FIG. 11, in a semiconductor light emitting device 113, an insulating layer 54 (for example, an $SiO_2$ layer) is provided on a second semiconductor layer 20 on the side of a major surface 10a of the second semiconductor layer 20 and a pad layer 55 is provided on the insulating layer 54. Then, on this occasion too, the pad layer 55 is electrically connected to a second electrode 50. Other than that can be regarded as similar to the semiconductor light emitting device 110 and hence explanations are omitted.

The transmissivity of the pad layer 55 to light emitted from a light emitting layer 30 is lower than that of the second electrode 50. The light emitted from the light emitting layer 30 (the part of the light emitting layer 30 opposing the pad layer 55) located immediately under the pad layer 55 is likely to get into the pad layer 55 and hence the light is hardly extracted to the outside of the device. It is desirable not to inject electric current into the light emitting layer 30 immediately under the pad layer 55 of a low transmissivity and not to emit light in order to improve the extraction efficiency of light and improve a substantial efficiency.

In the semiconductor light emitting device 113, it is possible to inhibit electric current to be injected into the light emitting layer 30 immediately under the pad layer 55 and improve efficiency by providing the insulating layer 54 between the pad layer 55 and the second semiconductor layer 20.

In this way, a pad layer 55 is acceptable as long as the pad layer 55 is provided on the side of a major surface 10a of a second semiconductor layer 20 and electrically connected to a second electrode 50.

In the case of the semiconductor light emitting device 113 too, it is possible to equalize the distribution of an injection current density, inhibit an excessively large injection current density, and obtain a semiconductor light emitting device of a high efficiency by continuously increasing the sheet resistance Rs of the second electrode 50 along the direction going from the pad layer 55 toward the first electrode 40.

Second Embodiment

Figure 12A:
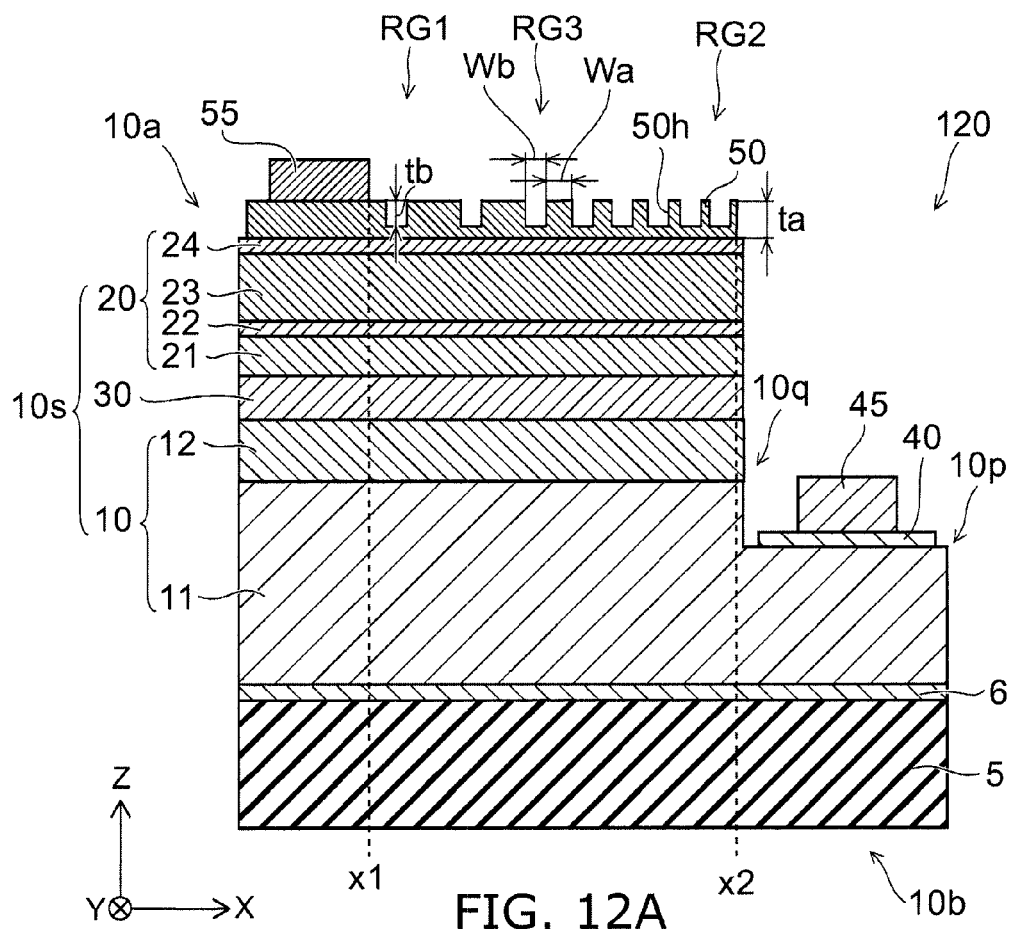
FIGS. 12A and 12B are schematic views showing the configuration of a semiconductor light emitting device according to a second embodiment.
Figure 12B:
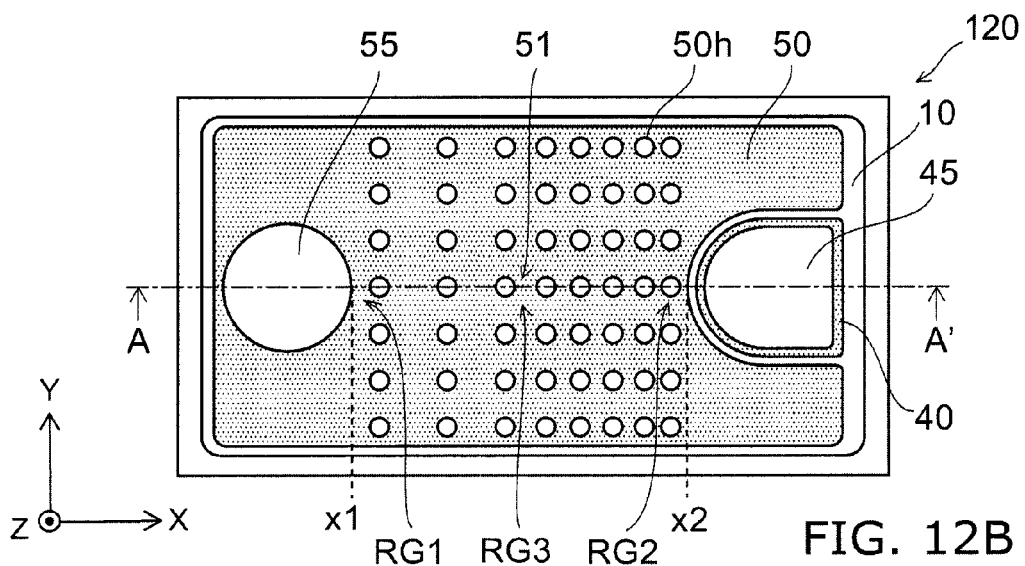

FIGS. 12A and 12B are schematic views showing the configuration of a semiconductor light emitting device according to a second embodiment.

FIG. 12B is a schematic plan view and FIG. 12A is a sectional view taken along A-A' line in FIG. 12B.

As shown in FIGS. 12A and 12B, in a semiconductor light emitting device 120 according to the embodiment, a plurality of recesses 50h (including holes) are provided in a second electrode 50. The second electrode 50 has a portion where the recesses 50h are not provided. Then the ratio of the recess width Wb of the recesses 50h along the X axis direction to the recess-to-recess width Wa of the portion where the recesses 50h are not provided along the X axis direction changes continuously along the direction going from a pad layer 55 toward a first electrode 40. On this occasion, it is also possible to make the thickness of the second electrode 50 (the thickness of the part where the recesses 50h are not provided) constant.

The specific example is the case where the recess width Wb is constant and the recess-to-recess width Wa changes. Then in the specific example, the thickness of the second electrode 50 (the thickness of the part where the recesses 50h are not provided) is a thickness ta and constant and may be the same as the first thickness t1 illustrated in FIG. 1 for example. Then the depth of the recesses 50h is a depth tb and constant. Here, the thickness of the second electrode 50 at the parts of the recesses 50h is equal to the difference between the thickness ta and the depth tb.

More specifically, the density of the recesses 50h increases continuously along the direction going from the pad layer 55 toward the first electrode 40. In this way, in the case of providing the recesses 50h in the second electrode 50, if the ratio of the area of the region of the recesses 50h to the whole area increases, a sheet resistance Rs increases. That is, in the case where the depth tb of the recesses 50h is constant and a recess ratio WR is defined as the value of recess width Wb/recess-to-recess width Wa, the sheet resistance Rs increases as the recess ratio WR increases.

Figure 13A:
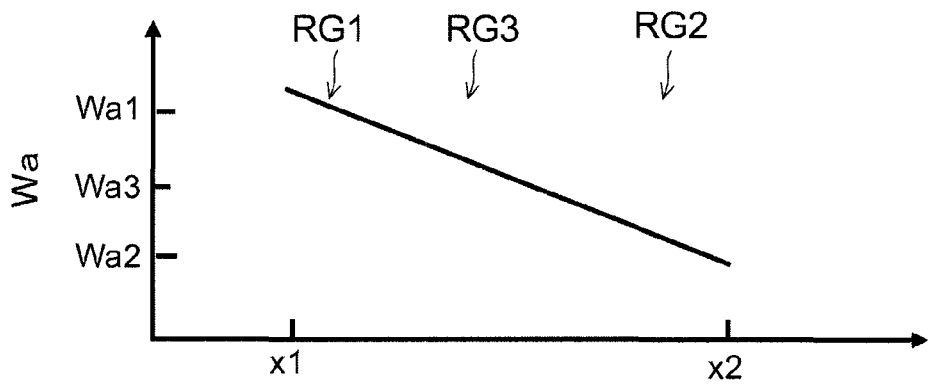
FIGS. 13A to 13C are graphs illustrating the characteristics of the semiconductor light emitting device according to the second embodiment.
Figure 13B:
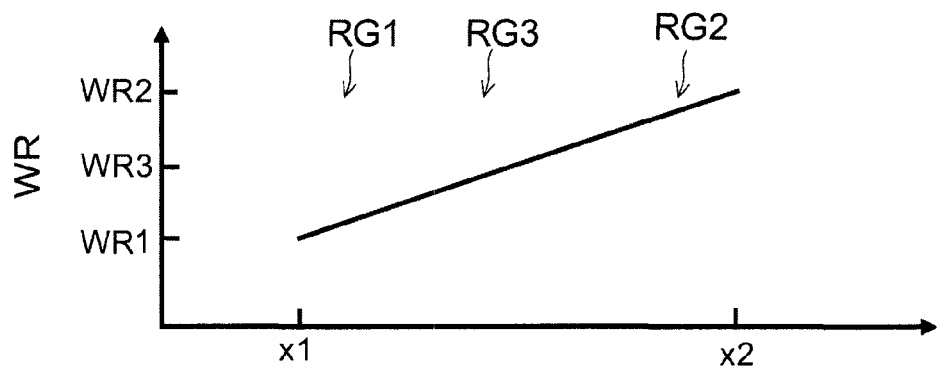
Figure 13C:
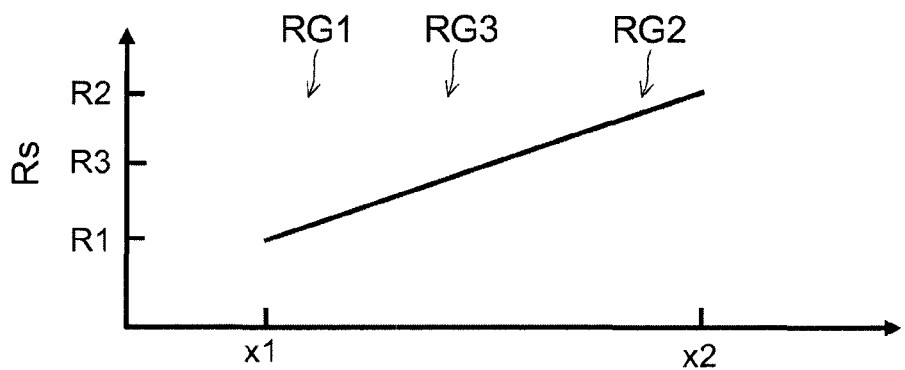

FIGS. 13A to 13C are graphs illustrating the characteristics of a semiconductor light emitting device according to the second embodiment.

That is, FIGS. 13A, 13B, and 13C show the changes of the recess-to-recess width Wa, the recess ratio WR, and the sheet resistance Rs of a second electrode 50 along the X axis direction, respectively. Each of the horizontal axes in those figures represents a position x along the X axis direction and the vertical axes in FIGS. 13A, 13B, and 13C represent the recess-to-recess width Wa, the recess ratio WR, and the sheet resistance Rs, respectively.

As shown in FIG. 13A, in a semiconductor light emitting device 120 according to the embodiment, the recess-to-recess width Wa decreases continuously as the position x shifts from a first position x1 to a second position x2. That is, the recess-to-recess width Wa at the first position x1 (in a first region RG1) on the side of a pad layer 55 is a first recess-to-recess width Wa1, the recess-to-recess width Wa at the second position x2 (in a second region RG2) on the side of a first electrode 40 is a second recess-to-recess width Wa1 that is smaller than the first recess-to-recess width Wa1, and the recess-to-recess width Wa in an intermediate region (in a third region RG3) is a third recess-to-recess width Wa3 that is a value between them.

Thereby, as shown in FIG. 13B, the recess ratio WR increases continuously as the position x shifts from the first position x1 to the second position x2. That is, the recess ratio WR at the first position x1 (in the first region RG1) is a first recess ratio WR1, the recess ratio WR at the second position x2 (in the second region RG2) is a second recess ratio WR2 that is larger than the first recess ratio WR1, and the recess ratio WR in an intermediate region (in the third region RG3) is a third recess ratio WR3 that is a value between them.

Thereby, as shown in FIG. 13C, the substantial sheet resistance Rs increases continuously as the position x shifts from the first position x1 to the second position x2.

Consequently, with the semiconductor light emitting device 120, it is possible to equalize the distribution of an injection current density, inhibit an excessively large injection current density, and obtain a semiconductor light emitting device of a high efficiency.

Meanwhile, the recesses 50h can be formed for example by using a mask having an opening of a prescribed pattern shape and etching an electrically-conductive layer acting as the second electrode 50.

Although the above example is the case where the recess width Wb of the recesses 50h is constant and the recess-to-recess width Wa is changed along the X axis direction, it is also possible to make the recess-to-recess width Wa constant and change the recess width Wb of the recesses 50h along the X axis direction, or change both the recess width Wb and the recess-to-recess width Wa along the X axis direction. That is, the recess ratio WR changes along the X axis direction.

Further, it is also possible to continuously change the depth tb of the recesses 50h along the direction going from a pad layer 55 toward a first electrode 40.

In addition, although, in the specific example, the pattern shape of the recesses 50h (the shape viewed along the Z axis direction) is a round shape as illustrated in FIG. 12B, the pattern shape of the recesses 50h can be selected arbitrarily. For example, the recesses 50h may be grooves extending along the Y axis direction. Otherwise, the pattern shape of the recesses 50h is neither a round shape nor a straight groove but may be a shape including various curved lines.

That is, the second electrode 50 has a plurality of recesses 50h and at least one of the recess width Wb (the length in the X axis direction) of the plural recesses 50h, the recess-to-recess width Wa (the distance in the X axis direction) between two recesses 50h, and the depth tb of the recesses 50h changes continuously along the X axis direction (along the direction going from the pad layer 55 toward the first electrode 40).

Here, in this case too, "changing continuously" means that, with regard to a characteristic related to at least one of the recess width Wb, the recess-to-recess width Wa, and the depth tb of the recesses 50h, an intermediate region (a third region RG3) having an intermediate value of the characteristic is provided between the first region RG1 and the second region RG2.

Figure 14:
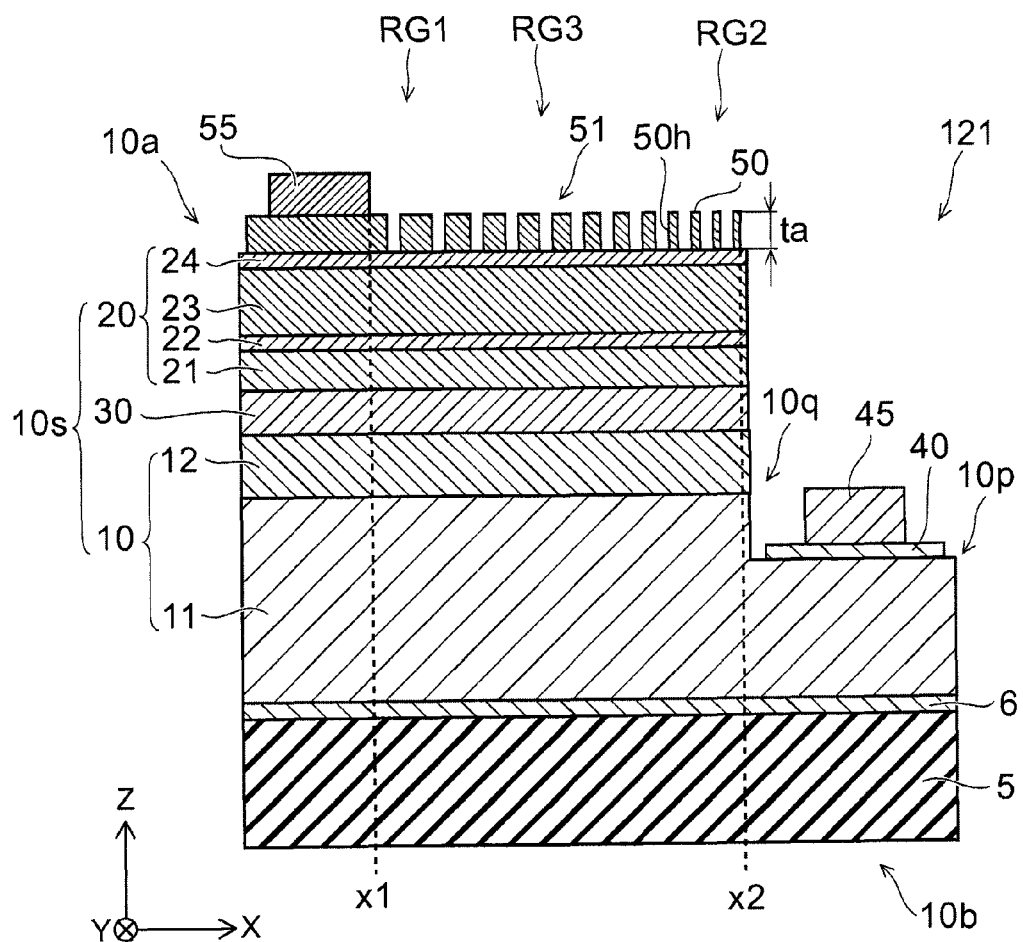
FIG. 14 is schematic cross sectional view showing the configuration of another semiconductor light emitting device according to the second embodiment.

FIG. 14 is schematic cross sectional view showing the configuration of another semiconductor light emitting device according to the second embodiment.

As shown in FIG. 14, in another semiconductor light emitting device 121 according to the embodiment, the recesses 50h provided in a second electrode 50 penetrate through the second electrode 50 along the Z axis direction. Other than that can be regarded as similar to the semiconductor light emitting device 120 and hence explanations are omitted.

In this way, the recesses 50h may penetrate through the second electrode 50 along the thickness direction. Then a recess ratio WR (recess width Wb/recess-to-recess width Wa) changes continuously along the X axis direction (the direction going from a pad layer 55 toward a first electrode 40). That is, the second electrode 50 includes a plurality of holes (the recesses 50h) penetrating through the second electrode 50 and the portion where the plural holes are not provided. The ratio of the width of the holes along the X axis direction to the width of the portion along the X axis direction changes continuously along the X axis direction. Thereby, as a position x shifts from a first position x1 to a second position x2, it is possible to continuously and gradually increase a substantial sheet resistance Rs, equalize the distribution of an injection current density, inhibit an excessively large injection current density, and improve efficiency.

Meanwhile, when the recesses 50h penetrate through the second electrode 50, since electric current is not injected at the parts of the recesses 50h, for example by reducing the recess width Wb of the recesses 50h to a value smaller than the case of the semiconductor light emitting device 120 and setting the number (density) of the recesses 50h at a value higher than the case of the semiconductor light emitting device 120, it is possible to inhibit the influence caused by not injecting electric current at the parts of the recesses 50h and obtain desired characteristics.

In addition, it is also possible that the second electrode 50 has a plurality of holes penetrating through the second electrode 50 (the recesses 50h illustrated in FIG. 14) and the density of the holes may change continuously along the X axis direction.

Third Embodiment

Figure 15:
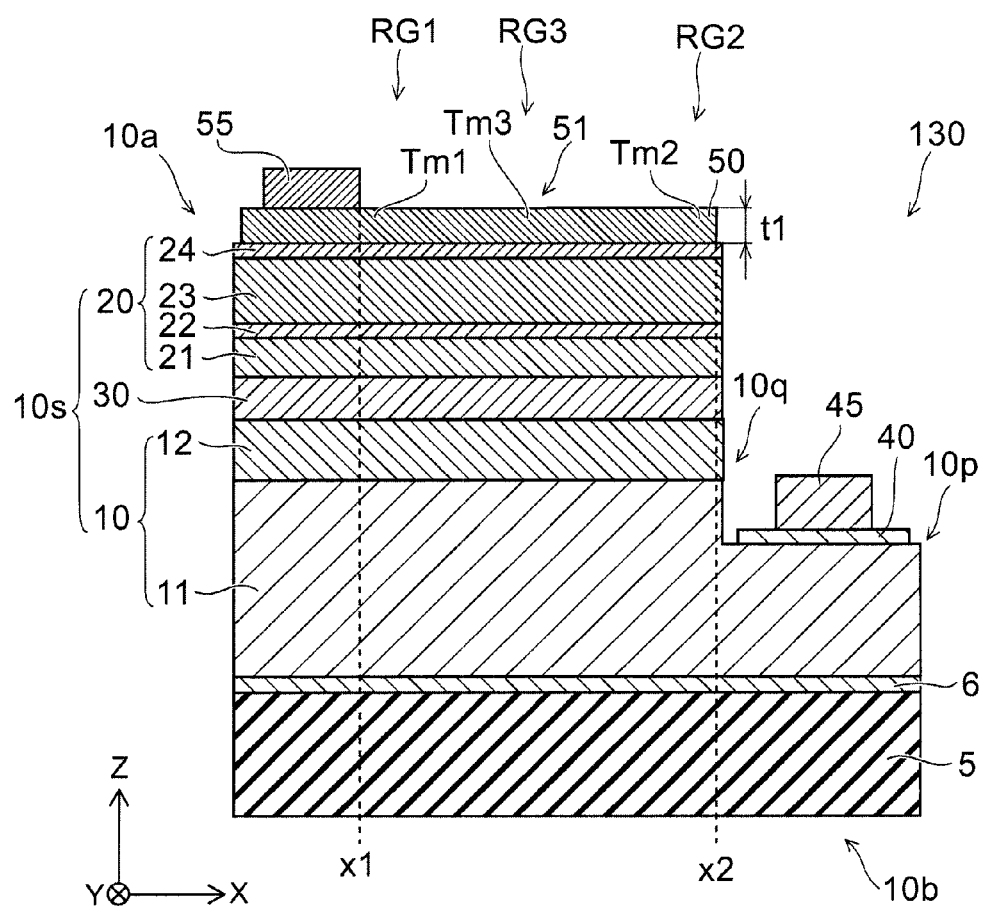
FIG. 15 is a schematic cross sectional view illustrating the configuration of a semiconductor light emitting device according to a third embodiment.

FIG. 15 is a schematic cross sectional view illustrating the configuration of a semiconductor light emitting device according to a third embodiment.

As shown in FIG. 15, in a semiconductor light emitting device 130 according to the embodiment, the electric conductivity of a second electrode 50 changes continuously along the direction going from a pad layer 55 toward a first electrode 40. On this occasion, it is possible to make the thickness of the second electrode 50 (the thickness of the part where recesses 50h are not provided) constant.

For example, if the annealing temperature of a transparent conductive layer used for the second electrode 50 is high, the electric conductivity rises. By using the property, it is possible to continuously lower the annealing temperature of a transparent conductive layer along the direction going from the pad layer 55 toward the first electrode 40 and thereby change a sheet resistance Rs.

For example, the annealing temperature of a transparent conductive layer in a first region RG1 is a first annealing temperature Tm1 that is a high temperature, the annealing temperature in a second region RG2 is a second annealing temperature Tm2 that is lower than the first annealing temperature Tm1, and the annealing temperature in a third region RG3 between the first region RG1 and the second region RG2 is a third annealing temperature Tm3 that is lower than the first annealing temperature Tm1 but higher than the second annealing temperature Tm2.

For example, the transparent conductive layer acting as the second electrode 50 is irradiated locally with laser light, the output and the scanning speed of the laser light are controlled, and the irradiation energy of the laser light is controlled so as to be high in the first region RG1, low in the second region RG2, and intermediate in the third region RG3.

Thereby, it is possible to continuously decrease the size of particles included in the second electrode 50 along the direction going from the pad layer 55 toward the first electrode 40 and continuously decrease the electric conductivity of the second electrode 50 along the direction going from the pad layer 55 toward the first electrode 40. Here, the size of the particles contained in the second electrode 50 can be obtained by observing the second electrode 50 with a transmission electron microscope or the like for example. In addition, the particle size on this occasion can be represented by the average value or the maximum value of the sizes of plural particles.

Figure 16A:
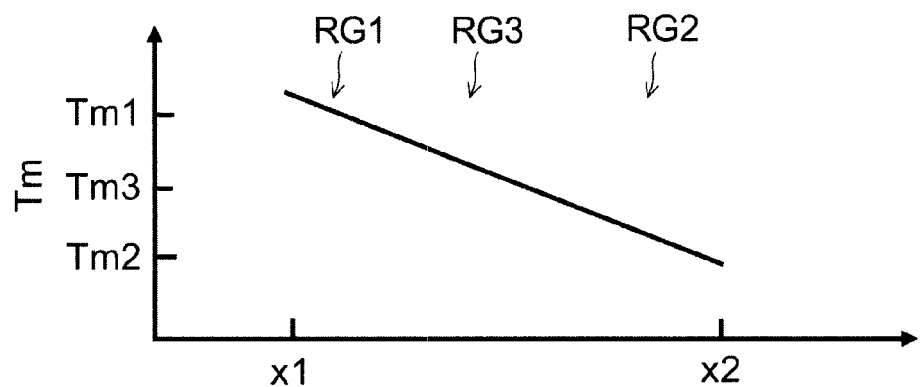
FIGS. 16A to 16c are graphs illustrating the characteristics of the semiconductor light emitting device according to the third embodiment.
Figure 16B:
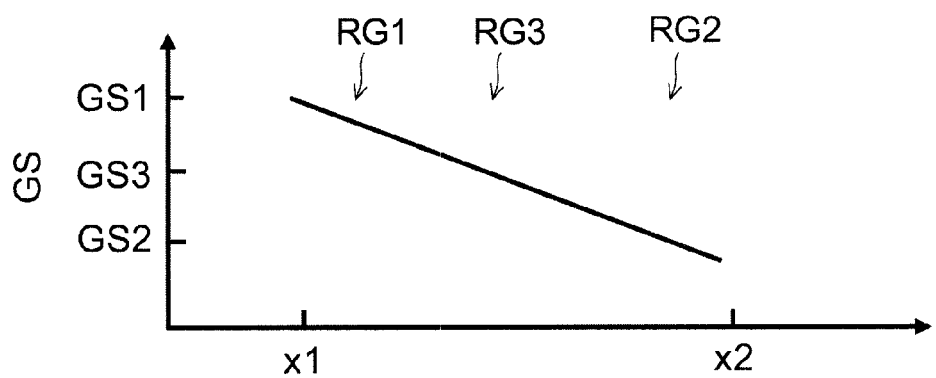
Figure 16C:
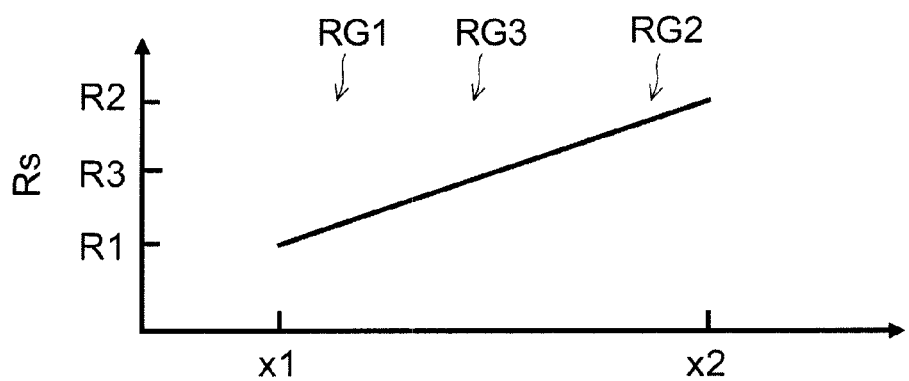

FIGS. 16A to 16c are graphs illustrating the characteristics of a semiconductor light emitting device according to the third embodiment.

That is, FIGS. 16A, 16B, and 16C show the changes of the annealing temperature Tm of a second electrode 50, the particle size GS of the particles included in the second electrode 50, and a sheet resistance Rs along the X axis direction, respectively. Each of the horizontal axes in the figures represents a position x along the X axis direction. The vertical axes in FIGS. 16A, 16B, and 16C represent the annealing temperature Tm, the particle size GS, and the sheet resistance Rs, respectively.

As shown in FIG. 16A, in a semiconductor light emitting device 130 according to the embodiment, the annealing temperature Tm lowers continuously as the position x shifts from a first position x1 to a second position x2. That is, the annealing temperature Tm is a first annealing temperature Tm1 of a high temperature at the first position x1 (in a first region RG1), a second annealing temperature Tm2 of a low temperature at the second position x2 (in a second region RG2), and a third annealing temperature Tm3 of an intermediate temperature in the intermediate region (in a third region RG3).

Thereby, as shown in FIG. 16B, the particle size GS of the particles included in the second electrode 50 decreases continuously as the position x shifts from the first position x1 to the second position x2. That is, the particle size GS decreases gradually. That is, the particle size GS is a first particle size GS1 of a large size at the first position x1 (in the first region RG1), a second particle size GS2 that is smaller than the first particle size at the second position x2 (in the second region RG2), and a third particle size GS3 that is a particle size between them in the intermediate region (in the third region RG3).

Thereby, as shown in FIG. 16C, the sheet resistance Rs increases continuously as the position x changes from the first position x1 to the second position x2. That is, the sheet resistance Rs increases gradually.

Thereby, with the semiconductor light emitting device 130, it is possible to equalize the distribution of an injection current density, inhibit an excessively large injection current density, and obtain a semiconductor light emitting device of a high efficiency.

In a semiconductor light emitting device according to the embodiment, the sheet resistance of a second electrode 50 increases continuously, namely gradually, along the direction going from a pad layer 55 toward a first electrode 40 and, to that end, it is acceptable if at least one of the thickness of the second electrode 50, the recess ratio WR and the depth tb of recesses 50h provided in the second electrode 50, and the electric conductivity of the second electrode 50 changes continuously along the direction going from the pad layer 55 toward the first electrode 40, and also it is acceptable to simultaneously change two or more of the above items.

In the embodiment, it is possible to equalize the distribution of an injection current density, inhibit an excessively large injection current density, and provide a semiconductor light emitting device of a high efficiency.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

Hereinabove, exemplary embodiments of the invention are described with reference to specific examples. However, the invention is not limited to the specific examples. For example, one skilled in the art may similarly practice the invention by appropriately selecting the shapes, sizes, materials, positional relationships, etc. of specific configurations of the components constituting a semiconductor light emitting device such as a first semiconductor layer, a second semiconductor layer, a light emitting layer, a quantum well layer, a barrier layer, a first electrode, a second electrode, a pad layer, a first electrode pad layer, an insulating layer, etc., from known art. Such practice, even though the crystal growth process is variously modified by one skilled in the art, is included in the scope of the invention to the extent that similar effects thereto are obtained.

Further, any two or more components of the specific examples may be combined within the extent of technical feasibility and are included in the scope of the embodiments to the extent that the spirit of the embodiments is included.

Moreover, all semiconductor light emitting devices practicable by an appropriate design modification by one skilled in the art on the basis of the semiconductor light emitting devices described above as embodiments of the invention also are within the scope of the invention to the extent that the purport of the embodiments of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
    a stacked structure body including:
        a first semiconductor layer of a first conductivity type, the first semiconductor layer having a first portion, and a second portion provided adjacent to the first portion in a plane parallel to a surface of the first semiconductor layer,
        a light emitting layer provided on the second portion, and
        a second semiconductor layer of a second conductivity type provided on the light emitting layer;
    a first electrode provided on the first portion and contacting the first semiconductor layer;
    a second electrode provided on the second semiconductor layer, contacting the second semiconductor layer and being transmittable with respect to light emitted from the light emitting layer; and
    a pad layer being electrically connected to the second electrode, a transmittance of the pad layer to the light being lower than a transmittance of the second electrode to the light,
    a sheet resistance of the second electrode increasing continuously along a direction going from the pad layer toward the first electrode.

2. The device according to claim 1, wherein an increase rate of the sheet resistance along the direction changes along the direction.

3. The device according to claim 1, wherein an increase rate of the sheet resistance along the direction decreases along the direction.

4. The device according to claim 1, wherein an increase rate of the sheet resistance along the direction increases along the direction.

5. The device according to claim 1, wherein a thickness of the second electrode decreases continuously along the direction going from the pad layer toward the first electrode.

6. The device according to claim 5, wherein
the second electrode has a first region close to the pad layer, a second region closer to the first electrode than the first region, and a third region between the first region and the second region, and
a first thickness of the second electrode in the first region is larger than a second thickness of the second electrode in the second region and a third thickness of the second electrode in the third region is smaller than the first thickness and larger than the second thickness.

7. The device according to claim 5, wherein a decrease rate of the thickness of the second electrode changes along the direction.

8. The device according to claim 5, wherein a decrease rate of the thickness of the second electrode decreases along the direction.

9. The device according to claim 5, wherein a decrease rate of the thickness of the second electrode increases along the direction.

10. The device according to claim 1, wherein
the second electrode has a plurality of recesses and a portion where the plurality of recesses are not provided and
a ratio of a width of each of the recesses along the direction to a width of the portion along the direction changes continuously along the direction.

11. The device according to claim 1, wherein the second electrode has a plurality of recesses, and
a density of the recesses changes continuously along the direction.

12. The device according to claim 1, wherein the second electrode has a plurality of recesses, and
a depth of the recesses changes continuously along the direction.

13. The device according to claim 1, wherein
the second electrode has a plurality of holes penetrating through the second electrode and a portion where the plural holes are not provided, and
a ratio of a width of each of the holes in the direction to a width of the portion along the X axis direction changes continuously along the direction.

14. The device according to claim 1, wherein the second electrode has a plurality of holes penetrating through the second electrode and a density of the holes changes continuously along the direction.

15. The device according to claim 1, wherein the second electrode contains particles and a particle size of the particles changes continuously along the X axis direction.

16. The device according to claim 1, wherein the second electrode contains particles and a particle size of the particles decreases continuously along the X axis direction.

17. The device according to claim 16, wherein
the second electrode has a first region close to the pad layer, a second region closer to the first electrode than the first region, and a third region between the first region and the second region, and
a first particle size in the second electrode in the first region is larger than a second particle size in the second electrode in the second region and a third particle size in the second electrode in the third region is smaller than the first particle size and larger than the second particle size.

18. The device according to claim 1, wherein the second electrode has a part where the sheet resistance is 6 Ω/square and a part where the sheet resistance is 10 Ω/square.

19. The device according to claim 1, wherein the second electrode includes oxide containing at least one of indium, tin and zinc.

20. The device according to claim 1, wherein the first conductivity type is an n-type and the second conductivity type is a p-type.

21. The device according to claim 1, wherein
the first semiconductor layer is made of n-type nitride semiconductor,
the light emitting layer is made of nitride semiconductor,
the second semiconductor layer is made of p-type nitride semiconductor, and
the sheet resistance of the second electrode increases continuously along the direction to control a current density of electric current injected into a semiconductor layer.

* * * * *